(12) United States Patent
Hattori et al.

(10) Patent No.: US 9,450,065 B2
(45) Date of Patent: Sep. 20, 2016

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Shigeki Hattori, Kanagawa-ken (JP); Reika Ichihara, Kanagawa-ken (JP); Masaya Terai, Tokyo (JP); Hideyuki Nishizawa, Tokyo (JP); Tsukasa Tada, Tokyo (JP); Koji Asakawa, Kanagawa-ken (JP); Hiroyuki Fuke, Kanagawa-ken (JP); Satoshi Mikoshiba, Kanagawa-ken (JP); Yoshiaki Fukuzumi, Kanagawa-ken (JP); Hideaki Aochi, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/495,958

(22) Filed: Sep. 25, 2014

(65) Prior Publication Data
US 2015/0044835 A1 Feb. 12, 2015

Related U.S. Application Data

(62) Division of application No. 14/105,565, filed on Dec. 13, 2013, now Pat. No. 9,000,504, which is a division of application No. 13/234,657, filed on Sep. 16, 2011, now Pat. No. 8,633,526.

(30) Foreign Application Priority Data

Nov. 10, 2010 (JP) .................................. 2010-252381

(51) Int. Cl.
*H01L 21/338* (2006.01)
*H01L 29/51* (2006.01)
(Continued)

(52) U.S. Cl.
CPC ....... *H01L 29/513* (2013.01); *H01L 21/02118* (2013.01); *H01L 21/02227* (2013.01);
(Continued)

(58) Field of Classification Search
CPC .......... H01L 27/1157; H01L 27/1158; H01L 27/11582; H01L 27/11556; H01L 21/02118; H01L 21/28282; H01L 27/11573; H01L 51/0591; H01L 29/513; H01L 21/02227
See application file for complete search history.

(56) References Cited

U.S. PATENT DOCUMENTS

| 7,642,546 B2 | 1/2010 | Misra et al. |
| 7,847,334 B2 | 12/2010 | Katsumata et al. |

(Continued)

FOREIGN PATENT DOCUMENTS

| JP | 2007/266143 | 10/2007 |
| JP | 2008-211186 A | 9/2008 |

(Continued)

OTHER PUBLICATIONS

Tuo-Hung Hou et al., Applied Physics Letters 89, 253113 "Programmable molecular orbital states of $C_{60}$ from intergrated circuits," 2006 American Institute of Physics.

(Continued)

*Primary Examiner* — Cuong B Nguyen
(74) *Attorney, Agent, or Firm* — Oblon, McClelland, Maier & Neustadt, L.L.P.

(57) ABSTRACT

According to one embodiment, a nonvolatile semiconductor memory device includes a first stacked structure body, a first semiconductor layer, a first organic film, a first semiconductor-side insulating film, and a first electrode-side insulating film. The first stacked structure body includes a plurality of first electrode films stacked along a first direction and a first inter-electrode insulating film provided between the first electrode films. The first semiconductor layer is opposed to side faces of the first electrode films. The first organic film is provided between the side faces of the first electrode films and the first semiconductor layer and containing an organic compound. The first semiconductor-side insulating film is provided between the first organic film and the first semiconductor layer. The first electrode-side insulating film provided between the first organic film and the side faces of the first electrode films.

10 Claims, 21 Drawing Sheets

(51) Int. Cl.
  *H01L 27/115* (2006.01)
  *H01L 51/05* (2006.01)
  *H01L 21/28* (2006.01)
  *H01L 21/02* (2006.01)
(52) U.S. Cl.
  CPC ..... *H01L21/28282* (2013.01); *H01L 27/1157* (2013.01); *H01L 27/11556* (2013.01); *H01L 27/11573* (2013.01); *H01L 27/11582* (2013.01); *H01L 51/0591* (2013.01)

(56) References Cited

U.S. PATENT DOCUMENTS

| | | |
|---|---|---|
| 7,936,004 B2 | 5/2011 | Kito et al. |
| 2004/0120180 A1 | 6/2004 | Rotenberg et al. |
| 2007/0108441 A1 | 5/2007 | Sekine et al. |
| 2008/0191256 A1 | 8/2008 | Bidan et al. |
| 2009/0085094 A1 | 4/2009 | Lee et al. |
| 2009/0230449 A1 | 9/2009 | Sakaguchi et al. |
| 2009/0242966 A1* | 10/2009 | Son ................ H01L 27/11578 257/324 |
| 2010/0044776 A1 | 2/2010 | Ishiduki et al. |
| 2010/0096682 A1 | 4/2010 | Fukuzumi et al. |
| 2010/0163108 A1 | 7/2010 | Bessho et al. |
| 2010/0213537 A1 | 8/2010 | Fukuzumi et al. |
| 2010/0308391 A1 | 12/2010 | Kim et al. |

FOREIGN PATENT DOCUMENTS

| | | |
|---|---|---|
| JP | 2008-211186 A5 | 9/2008 |
| JP | 2009-81444 | 4/2009 |
| JP | 2010-199314 | 9/2010 |
| WO | WO 2005/114761 A1 | 12/2005 |
| WO | WO 2006/031260 A2 | 3/2006 |

OTHER PUBLICATIONS

Japanese Office Action issued Feb. 5, 2014, in Japan Patent Application No. 2010-252381 (with English translation).

Office Action issued Jun. 27, 2014, in Japanese Patent Application No. 2010-252381 with English translation.

Office Action issued Jul. 2, 2015 in Japanese Patent Application No. 2014-183130 (with English language translation).

Zhiming Liu, et al., "Molecular Memories That Survive Silicon Device Processing and Real-World Operation", Science, vol. 302, Nov. 2003, pp. 1543-1545.

* cited by examiner

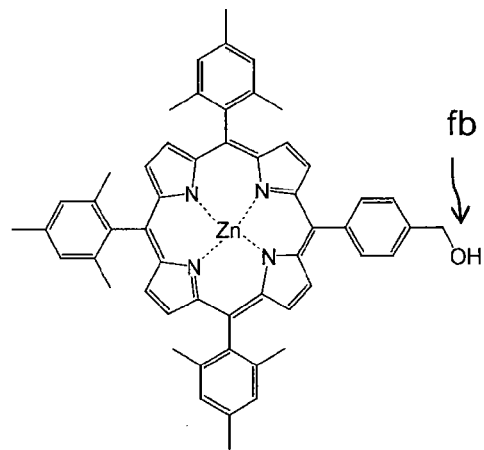
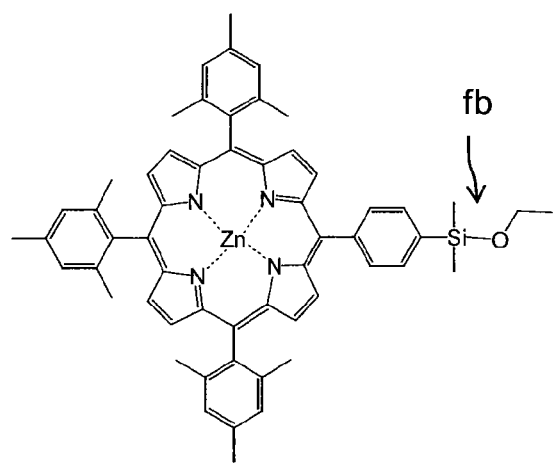
FIG. 6A  FIG. 6B
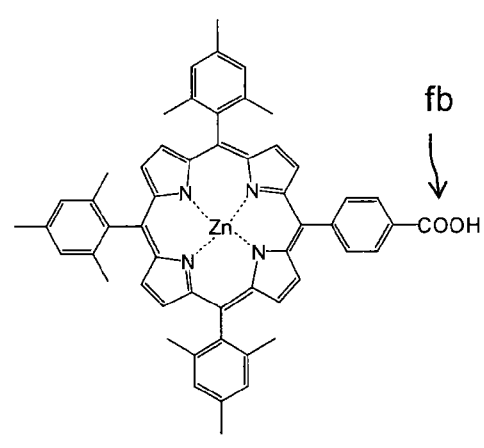
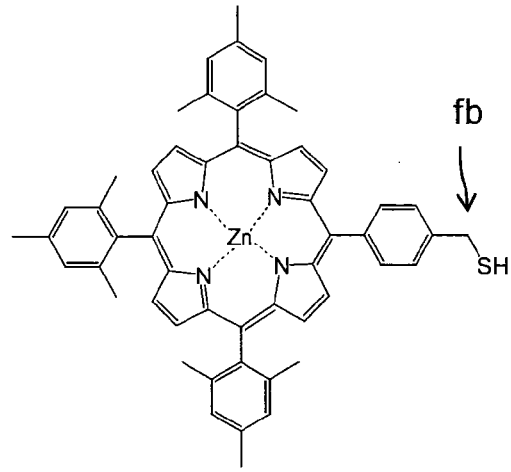
FIG. 6C  FIG. 6D

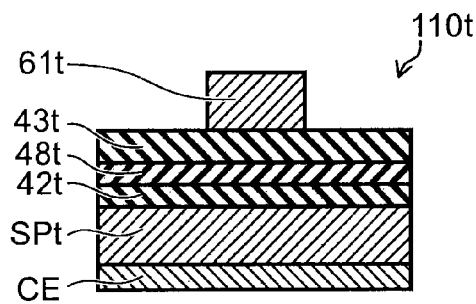 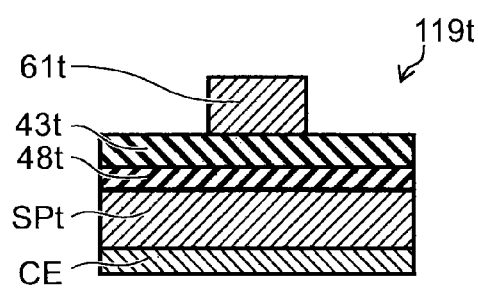
FIG. 11A  FIG. 11B
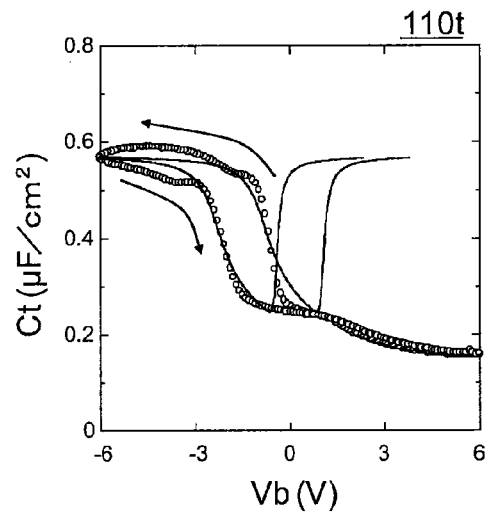 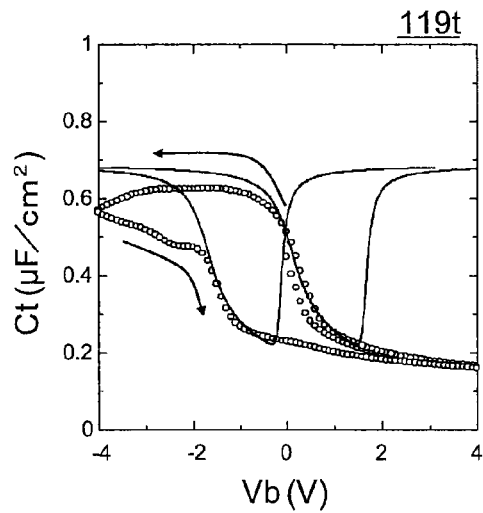
FIG. 12A  FIG. 12B

NONVOLATILE SEMICONDUCTOR MEMORY DEVICE AND METHOD FOR MANUFACTURING SAME

CROSS-REFERENCE TO RELATED APPLICATIONS

This application is a division of and claims the benefit of priority under 35 U.S.C. §120 from U.S. Ser. No. 14/105,565 filed Dec. 13, 2013, which is a division of U.S. Ser. No. 13/234,657 filed Sep. 16, 2011 (now U.S. Pat. No. 8,633,526 issued Jan. 21, 2014), and claims the benefit of priority under 35 U.S.C. §119 from Japanese Patent Application No. 2010-252381 filed Nov. 10, 2010; the entire contents of each of which are incorporated herein by reference.

FIELD

Embodiments described herein relate generally to a nonvolatile semiconductor memory device and a method for manufacturing the same.

BACKGROUND

To increase the memory capacity of nonvolatile semiconductor memory devices, a three-dimensional stacked memory is presented. The three-dimensional stacked memory includes, for example, a stacked structure body including alternately stacked insulating films and electrode films, a silicon pillar penetrating through the stacked structure body in the stacking direction, and a charge storage layer (memory layer) between the silicon pillar and the electrode films. Thereby, a memory cell is provided at the intersection of the silicon pillar and each electrode film. Further, also a configuration using a U-shaped memory string in which two silicon pillars are connected on the side of a substrate may be devised.

There is room for improvement to further increase the integration degree of the three-dimensional stacked memory.

BRIEF DESCRIPTION OF THE DRAWINGS

FIG. 6A to FIG. 6D are diagrams illustrating materials used for the nonvolatile semiconductor memory device according to the embodiment;

FIG. 11A and FIG. 11B are schematic cross-sectional views illustrating the configurations of samples corresponding to nonvolatile semiconductor memory devices;

FIG. 12A and FIG. 12B are graphs illustrating characteristics of the samples corresponding to the nonvolatile semiconductor memory devices;

DETAILED DESCRIPTION

Figure 1:
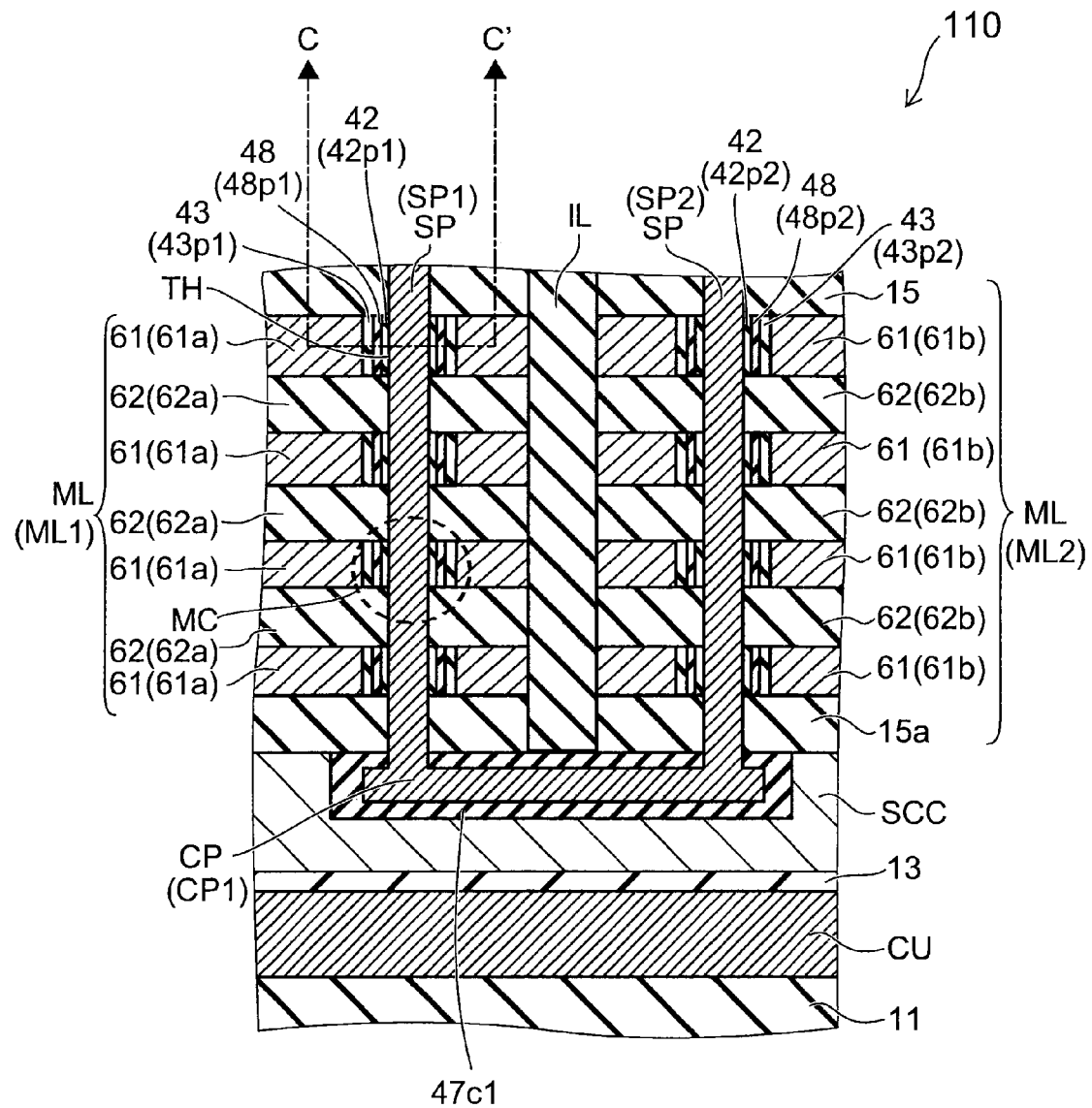
FIG. 1 is a schematic cross-sectional view illustrating the configuration of a nonvolatile semiconductor memory device according to a first embodiment.

According to one embodiment, a nonvolatile semiconductor memory device includes a first stacked structure body, a first semiconductor layer, a first organic film, a first semiconductor-side insulating film, and a first electrode-side insulating film. The first stacked structure body includes a plurality of first electrode films stacked along a first direction and a first inter-electrode insulating film provided between the first electrode films. The first semiconductor layer is opposed to side faces of the first electrode films. The first organic film is provided between the side faces of the first electrode films and the first semiconductor layer and containing an organic compound. The first semiconductor-side insulating film is provided between the first organic film and the first semiconductor layer. The first electrode-side insulating film provided between the first organic film and the side faces of the first electrode films.

According to one other embodiment, a method for manufacturing a nonvolatile semiconductor memory device is disclosed. The device includes a stacked structure body, a semiconductor layer, an organic film, a semiconductor-side insulating film, and an electrode-side insulating film. The stacked structure body includes a plurality of electrode films stacked along a first direction and an inter-electrode insulating film provided between the electrode films. The semiconductor layer is opposed to side faces of the electrode films. The organic film is provided between the side faces of the electrode films and the semiconductor layer and contains an organic compound. The semiconductor-side insulating film is provided between the organic film and the semiconductor layer. The electrode-side insulating film is provided between the organic film and the side faces of the electrode films. The method can include alternately stacking a plurality of first films and a plurality of second films along the first direction to form a base stacked body forming at least part of the stacked structure body. The method can include forming a through hole penetrating through the base stacked body along the first direction and burying a semiconductor in the through hole to form the semiconductor layer. The method can include removing the first films. The method can include forming an insulating film on a side face of the semiconductor layer exposed by removal of the first films to form the semiconductor-side insulating film. The method can include forming the organic film on the semiconductor-side insulating film. The method can include forming the electrode-side insulating film on the organic film. In addition, the method can include forming a conductive film on the electrode-side insulating film to form the electrode films.

According to one other embodiment, a method for manufacturing a nonvolatile semiconductor memory device is disclosed. The device includes a stacked structure body, a semiconductor layer, an organic film, a semiconductor-side insulating film, and an electrode-side insulating film. The stacked structure body includes a plurality of electrode films stacked along a first direction and an inter-electrode insulating film provided between the electrode films. The semiconductor layer is opposed to side faces of the electrode films. The organic film is provided between the side faces of the electrode films and the semiconductor layer and contains an organic compound. The semiconductor-side insulating film is provided between the organic film and the semiconductor layer. The electrode-side insulating film is provided between the organic film and the side faces of the electrode films. The method can include forming the stacked structure body. The method can include forming a through hole penetrating through the stacked structure body along the first direction. The method can include forming an insulating film on an inner wall surface of the through hole to form the electrode-side insulating film. The method can include forming the organic film on the electrode-side insulating film by a self-assembly method. The method can include forming the semiconductor-side insulating film on the organic film. In addition, the method can include burying a semiconductor in a remaining space of the through hole to form the semiconductor layer.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a nonvolatile semiconductor memory device according to a first embodiment.

Figure 2:
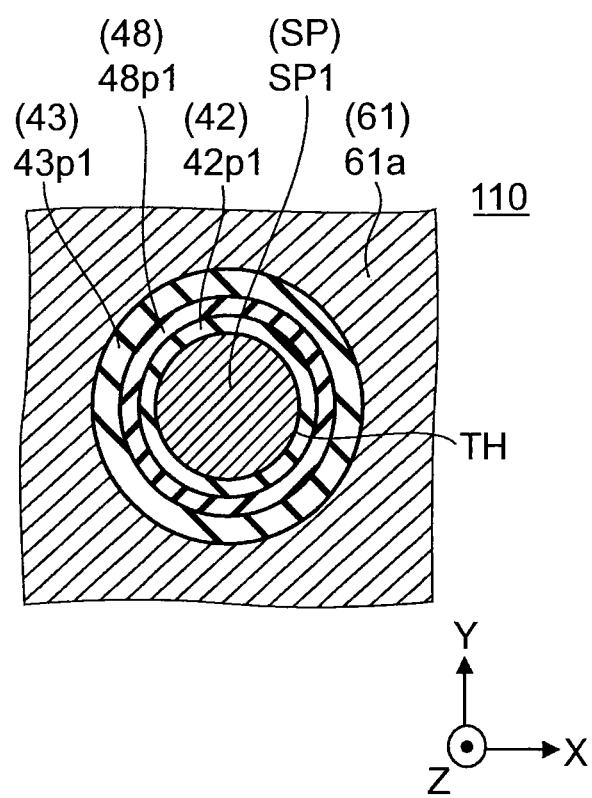
FIG. 2 is a schematic cross-sectional view illustrating the configuration of the nonvolatile semiconductor memory device according to the first embodiment.

FIG. 2 is a schematic cross-sectional view illustrating the configuration of the nonvolatile semiconductor memory device according to the first embodiment.

Figure 3:
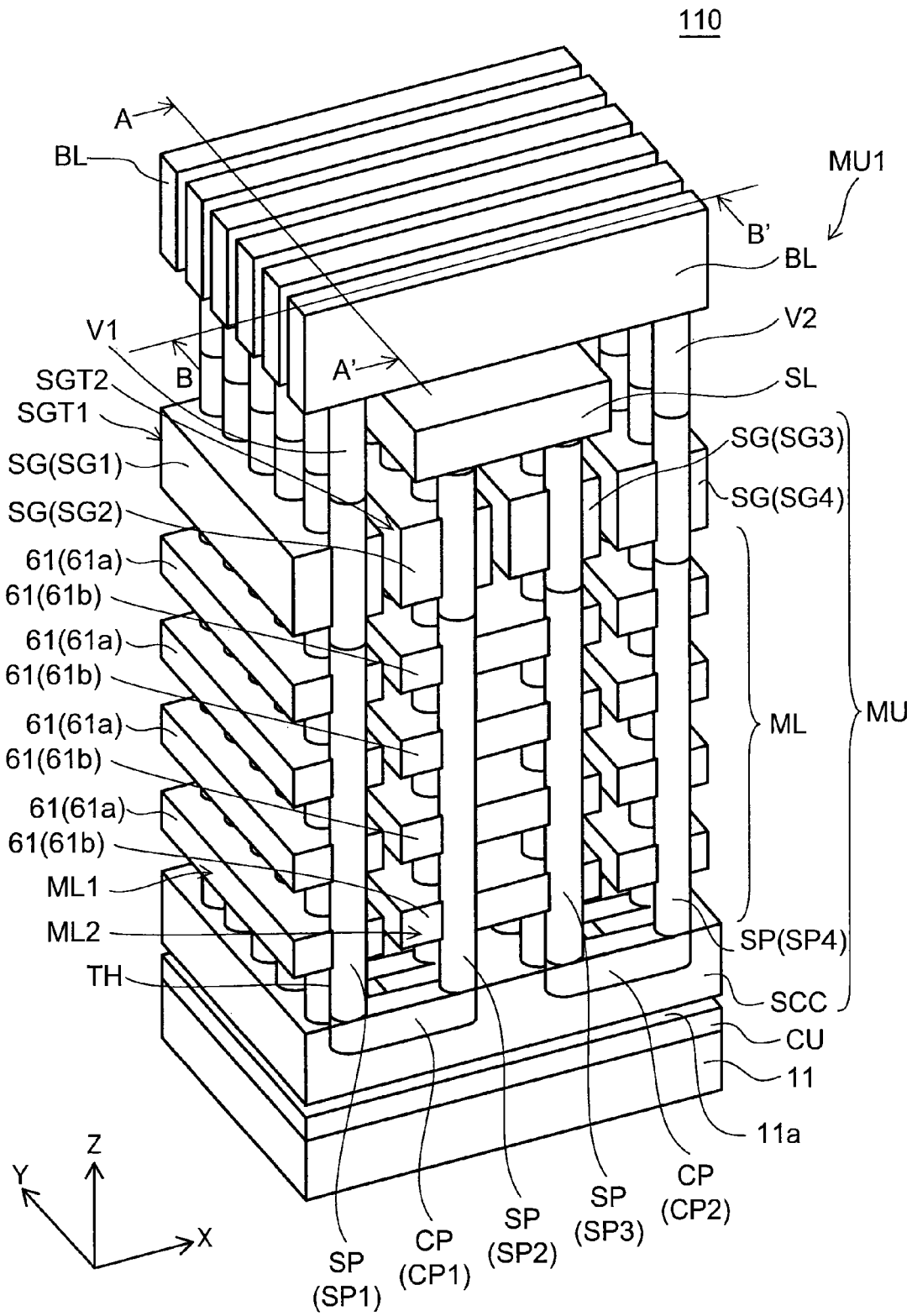
FIG. 3 is a schematic perspective view illustrating the configuration of the nonvolatile semiconductor memory device according to the first embodiment.

FIG. 3 is a schematic perspective view illustrating the configuration of the nonvolatile semiconductor memory device according to the first embodiment.

In FIG. 3, for easier viewing of the drawing, only conductive portions are shown and illustration of the insulating portions is omitted.

Figure 4:
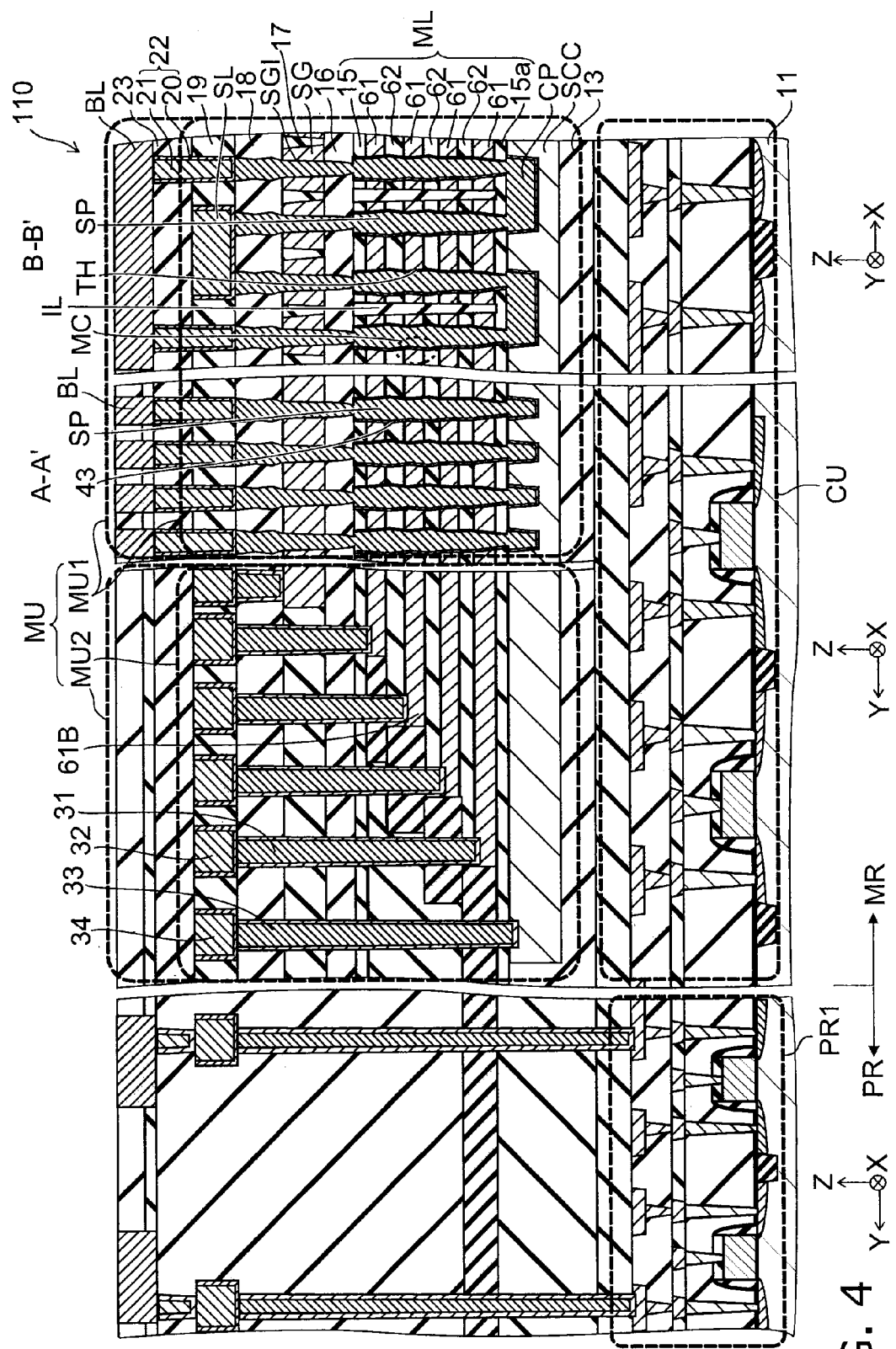
FIG. 4 is a schematic cross-sectional view illustrating the configuration of the nonvolatile semiconductor memory device according to the first embodiment.

FIG. 4 is a schematic cross-sectional view illustrating the configuration of the nonvolatile semiconductor memory device according to the first embodiment.

Figure 5:
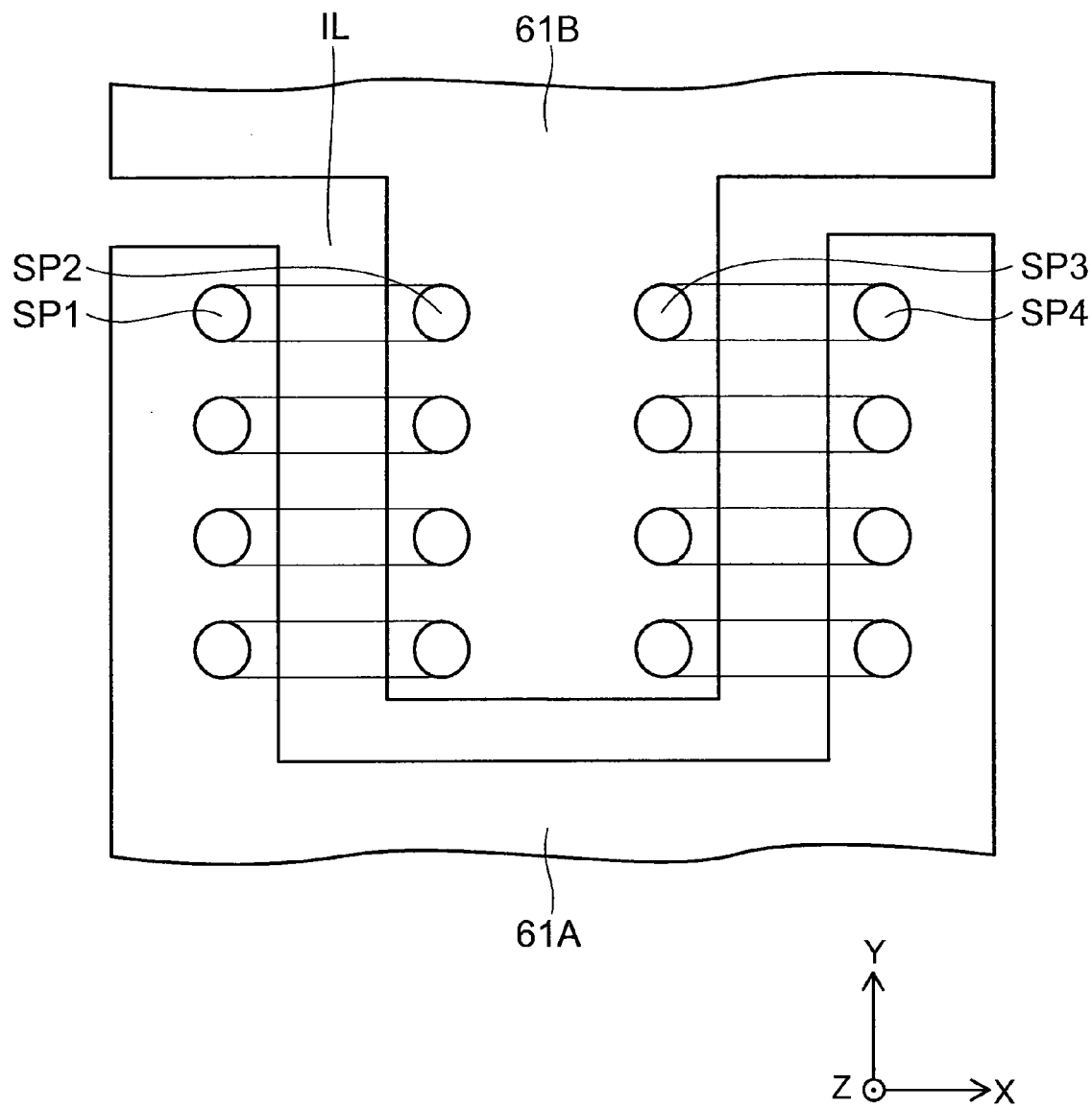
FIG. 5 is a schematic plan view illustrating the configuration of an electrode film of the nonvolatile semiconductor memory device according to the first embodiment.

FIG. 5 is a schematic plan view illustrating the configuration of an electrode film of the nonvolatile semiconductor memory device according to the first embodiment.

First, an outline of the configuration of the nonvolatile semiconductor memory device according to this embodiment is described with reference to FIG. 3 and FIG. 4.

As shown in FIG. 3 and FIG. 4, a nonvolatile semiconductor memory device 110 according to this embodiment includes a substrate 11 (a semiconductor substrate) made of, for example, single-crystal silicon.

As shown in FIG. 4, in the substrate 11, for example, a memory array region MR in which memory cells are formed and a peripheral region PR juxtaposed to the memory array region MR are defined. In the peripheral region PR, for example, various peripheral region circuits PR1 are provided on a major surface 11a of the substrate 11.

In the memory array region MR, a circuit unit CU, for example, is provided on the major surface 11a of the substrate 11. A memory unit MU is provided above the circuit unit CU. The circuit unit CU is provided as necessary and may be omitted.

As shown in FIG. 4, an interlayer insulating film 13 made of, for example, silicon oxide is provided between the circuit unit CU and the memory unit MU.

As shown in FIG. 4, the memory unit MU includes, for example, a matrix memory cell unit MU1 and an interconnection connection unit MU2. The matrix memory cell unit MU1 includes memory cell transistors arranged in a three-dimensional matrix configuration. In the interconnection connection unit MU2, the interconnections of the matrix memory cell unit MU1 are connected. The plurality of memory cell transistors are arranged in a three-dimensional matrix configuration along three directions, for example, a direction perpendicular to the major surface 11a of the substrate 11 and two different directions parallel to the major surface 11a.

FIG. 3 illustrates the configuration of the matrix memory cell unit MU1.

In FIG. 4, a portion of the cross section along line A-A' of FIG. 3 and a portion of the cross section along line B-B' of FIG. 3 are illustrated as the matrix memory cell unit MU1.

As shown in FIG. 3 and FIG. 4, in the matrix memory cell unit MU1, a stacked structure body ML is provided above the major surface 11a of the substrate 11.

The stacked structure body ML includes a plurality of electrode films 61 and a plurality of inter-electrode insulating films 62 alternately stacked along a first direction. The inter-electrode insulating film 62 insulates the electrode films 61 from each other.

In the specification of this application, "stack" includes not only the case where a plurality of layers are directly stacked but also the case where a plurality of layers are stacked via other components.

The stacking direction of the electrode films 61 and the inter-electrode insulating films 62 in the stacked structure body ML is taken as a Z-axis direction (the first direction). The Z-axis direction is the direction perpendicular to the major surface 11a of the substrate 11. One direction perpendicular to the Z-axis direction is taken as an X-axis direction (a second direction). The direction perpendicular to the Z-axis direction and the X-axis direction is taken as a Y-axis direction (a third direction).

The nonvolatile semiconductor memory device 110 further includes selection gate electrodes SG. The selection gate electrodes SG are stacked with the stacked structure body ML along the Z-axis direction.

The electrode film 61 includes a strip-shaped portion extending along the Y-axis direction. Also the selection gate electrode SG includes a strip-shaped portion extending along the Y-axis direction.

Semiconductor layers SP penetrating through the stacked structure body ML and the selection gate electrodes SG in the Z-axis direction are provided. In this specific example, the semiconductor layer SP is a semiconductor pillar extending along the Z-axis direction. The semiconductor layer SP is formed by, for example, burying a semiconductor in a through hole TH penetrating through the stacked structure body ML in the Z-axis direction. The semiconductor layer SP is in a columnar or a cylindrical shape extending along the Z-axis direction.

As described later, in the nonvolatile semiconductor memory device 110, the memory cell transistor including a memory layer is formed at the intersection of the electrode film 61 and the semiconductor layer SP. The memory cell transistors are arranged in a three-dimensional matrix configuration. A charge is stored in the memory layer. Thereby, each memory cell transistor functions as a memory cell MC that stores data.

Thus, the nonvolatile semiconductor memory device 110 includes a plurality of memory strings. The plurality of memory strings include a plurality of electrically rewritable memory cells MC. The plurality of memory cells MC are connected in series. At least part of the plurality of memory cells MC are arranged along the Z-axis direction. The plurality of memory strings are arranged in the X-Y plane in a matrix configuration.

Although four electrode films 61 are shown in FIG. 3 and FIG. 4, the number of electrode films 61 provided is arbitrary in the stacked structure body ML.

A portion penetrating through the stacked structure body ML and a portion penetrating through the selection gate electrode SG of the semiconductor layer SP are a layer made of a continuously formed semiconductor. Alternatively, a portion penetrating through the stacked structure body ML of the semiconductor layer SP and a portion penetrating through the selection gate electrode SG of the semiconductor layer SP are formed in different processes and these portions are electrically connected.

As illustrated in FIG. 4, an insulating film 15a may be provided under the lowermost electrode film 61 (for example, on the side nearest to the substrate 11) of the stacked structure body ML. The insulating film 15a may be included in the stacked structure body ML. An insulating film 15 may be provided on the uppermost electrode film 61 (for example, on the side farthest from the substrate 11) of the stacked structural body ML. The insulating film 15 may be included in the stacked structure body ML. Silicon oxide, for example, is used for the insulating films 15 and 15a. The embodiment is not limited thereto, but the material of the insulating films 15 and 15a is arbitrary.

An interlayer insulating film 16, for example, is provided between the stacked structure body ML and the selection gate electrode SG.

As shown in FIG. 4, an interlayer insulating film 17 dividing the selection gate electrodes SG along the Y-axis direction is provided. The interlayer insulating film 17 extends along the Y-axis direction.

An interlayer insulating film 18 is provided on the interlayer insulating film 17, and a source line SL and a contact electrode 22 are provided thereon. An interlayer insulating film 19 is provided around the source line SL.

An interlayer insulating film 23 is provided on the source line SL. A bit line BL is provided on the interlayer insulating film 23. The bit line BL has, for example, a strip shape along the X-axis direction. Silicon oxide, for example, is used for the interlayer insulating films 16, 17, 18, 19, and 23.

In the nonvolatile semiconductor memory device 110, the semiconductor layers SP are connected in twos on the side of the substrate 11.

That is, the nonvolatile semiconductor memory device 110 further includes a connection portion CP (e.g. a first connection portion CP) electrically connecting a first semiconductor layer SP1 and a second semiconductor layer SP2 on the side of the substrate 11. A semiconductor, for example, may be used for the connection portion CP. The material that forms the semiconductor layer SP, for example, may be used for the connection portion CP.

However, as described later, also a configuration is possible in which each of the semiconductor layers SP is independent and the semiconductor layers SP are not connected to one another. In the following, the case is described where the semiconductor layers SP are connected in twos.

As shown in FIG. 3, for example, a second to a fourth semiconductor layer SP2 to SP4 are further provided. The second semiconductor layer SP2 to the fourth semiconductor layer SP4 are juxtaposed to the first semiconductor layer SP1 in the X-axis direction. The second semiconductor layer SP2 is provided between the first semiconductor layer SP1 and the fourth semiconductor layer SP4. The third semiconductor layer SP3 is provided between the second semiconductor layer SP2 and the fourth semiconductor layer SP4.

The first semiconductor layer SP1 and the second semiconductor layer SP2 connected by a first connection portion CP1 make a pair to form one U-shaped NAND string. The third semiconductor layer SP3 and the fourth semiconductor layer SP4 connected by a second connection portion CP2 make a pair to form another U-shaped NAND string.

As shown in FIG. 5, the electrode films 61 penetrated through by the first semiconductor layer SP1 and the fourth semiconductor layer SP4 are commonly connected to form an electrode film 61A. The electrode films 61 penetrated through by the second semiconductor layer SP2 and the third semiconductor layer SP3 are commonly connected to form an electrode film 61B. In other words, the electrode film 61 has a form in which the electrode film 61A and the electrode film 61B are combined with each other in a comb teeth configuration.

As shown in FIG. 5, the electrode film 61A and the electrode film 61B are divided from each other by an insulating layer IL.

As illustrated in FIG. 4, in the interconnection connection unit MU2, the length in the Y-axis direction of each of the electrode films 61 (the electrode films 61A and the electrode films 61B) stacked along the Z-axis direction changes in a stairstep configuration. The electrode film 61B is connected to a word interconnection 32 by a contact electrode 31 at one end in the Y-axis direction. Thereby, the electrode film 61B is electrically connected to, for example, a driving circuit provided in the substrate 11. The electrode film 61A is connected to a word interconnection by a contact electrode at the other end in the Y-axis direction (not shown in FIG. 4). Thereby, the electrode film 61A is electrically connected to the driving circuit. Although the contact electrode 31 is connected to each of the electrode films 61 at the same position in the X-axis direction in FIG. 4, the contact electrodes 31 corresponding to the electrode films 61 are provided in different positions in the X-axis direction.

Thereby, in the electrode film 61 at a certain distance from the semiconductor substrate 11, the electric potential can be set different between the first semiconductor layer SP1 and the second semiconductor layer SP2 which constitute a pair. Thereby, the memory cells MC in this layer corresponding to the first semiconductor layer SP1 and the second semiconductor layer SP2 can operate independently from each other. This applies also to the third semiconductor layer SP3 and the fourth semiconductor layer SP4.

A connection portion conductive layer SCC described later is connected to a connection portion conductive layer interconnection 34 by a contact electrode 33, for example.

As shown in FIG. 3 and FIG. 4, each of the opposite ends of the semiconductor layers SP from the connection portions CP is connected to the bit line BL or the source line SL, and the selection gate electrode SG (a first to a fourth selection gate electrode SG1 to SG4) is provided to each of the semiconductor layers SP. Thereby, desired data can be written on or read out from an arbitrary memory cell MC of an arbitrary semiconductor layer SP.

The number of semiconductor layers SP provided in each electrode film 61 is arbitrary.

FIG. 1 illustrates the configuration of the matrix memory cell unit MU1, and is a cross-sectional view corresponding to, for example, a portion of the cross section along line B-B' of FIG. 3.

As shown in FIG. 1, the nonvolatile semiconductor memory device 110 includes the stacked structure body ML, the semiconductor layers SP, organic films 48, semiconductor-side insulating films 42, and electrode-side insulating films 43.

The stacked structure body ML includes the plurality of electrode films 61 stacked along the Z-axis direction and the inter-electrode insulating films 62 provided between the plurality of electrode films 61. The stacked structure body ML is, for example, a first stacked structure body ML1. The electrode film 61 is, for example, a first electrode film 61a. The inter-electrode insulating film 62 is, for example, a first inter-electrode insulating film 62a.

The semiconductor layer SP is, for example, the first semiconductor layer SP1. The organic film 48 is, for example, a first organic film 48p1. The semiconductor-side insulating film 42 is, for example, a first semiconductor-side insulating film 42p1. The electrode-side insulating film 43 is, for example, a first electrode-side insulating film 43p1. In the following, a description is given about the first stacked structure body ML1, the first electrode film 61a, the first inter-electrode insulating film 62a, the first semiconductor layer SP1, the first organic film 48p1, the first semiconductor-side insulating film 42p1, and the first electrode-side insulating film 43p1.

The first semiconductor layer SP1 is opposed to the side faces of the plurality of first electrode films 61a. The side face of the first electrode film 61a lies along the Z-axis direction. The side face of the first electrode film 61a is substantially parallel to the Z-axis direction, for example.

In the specification of this application, "oppose" includes not only the case of being directly opposed but also the case of being opposed via other components.

The first organic films 48p1 are provided between the side faces of the plurality of first electrode films 61a and the first semiconductor layer SP1. The first organic film 48p1 contains an organic compound.

The first semiconductor-side insulating films 42p1 are provided between the first organic films 48p1 and the first semiconductor layer SP1.

The first electrode-side insulating films 43p1 are provided between the first organic films 48p1 and the side faces of the plurality of first electrode films 61a.

In this specific example, the first semiconductor layer SP1 penetrates through the first stacked structure body ML1 along the Z-axis direction. The first semiconductor-side insulating film 42p1 surrounds the side face of the first semiconductor layer SP1. The first organic film 48p1 surrounds the side face of the first semiconductor-side insulating film 42p1. The first electrode-side insulating film 43p1 surrounds the side face of the first organic film 48p1. The first electrode film 61a surrounds the side face of the first electrode-side insulating film 43p1.

The side face of the first semiconductor layer SP1, the side face of the first semiconductor-side insulating film 42p1, the side face of the first organic film 48p1, and the side face of the first electrode-side insulating film 43p1 are surfaces parallel to the Z-axis direction.

As shown in FIG. 1, the nonvolatile semiconductor memory device 110 may further include a second stacked structure body ML2, the second semiconductor layer SP2, a second organic film 48p2, a second semiconductor-side insulating film 42p2, a second electrode-side insulating film 43p2, and the connection portion CP. The connection portion CP is, for example, the first connection portion CP1.

The second stacked structure body ML2 is juxtaposed to the first stacked structure body ML1 in the X-axis direction perpendicular to the Z-axis direction. The second stacked structure body ML2 includes a plurality of second electrode films 61b stacked along the Z-axis direction and second inter-electrode insulating films 62b provided between the plurality of second electrode films 61b.

The second semiconductor layer SP2 is opposed to the side faces of the plurality of second electrode films 61b. The side face of the second electrode film 61b lies along the Z-axis direction. The side face of the second electrode film 61b is substantially parallel to the Z-axis direction, for example.

The second organic films 48p2 are provided between the side faces of the plurality of second electrode films 61b and the second semiconductor layer SP2. The second organic film 48p2 contains an organic compound.

The second semiconductor-side insulating films 42p2 are provided between the second organic films 48p2 and the second semiconductor layer SP2.

The second electrode-side insulating films 43p2 are provided between the second organic films 48p2 and the side faces of the plurality of second electrode films 61b.

The connection portion CP electrically connects the first semiconductor layer SP1 and the second semiconductor layer SP2.

In this specific example, the second semiconductor layer SP2 penetrates through the second stacked structure body ML2 along the Z-axis direction. The second semiconductor-side insulating film 42p2 surrounds the side face of the second semiconductor layer SP2. The second organic film 48p2 surrounds the side face of the second semiconductor-side insulating film 42p2. The second electrode-side insulating film 43p2 surrounds the side face of the second organic film 48p2. The second electrode film 61b surrounds the side face of the second electrode-side insulating film 43p2.

The connection portion CP electrically connects one end of the first semiconductor layer SP1 and one end of the second semiconductor layer SP2.

The side face of the second semiconductor layer SP2, the side face of the second semiconductor-side insulating film 42p2, the side face of the second organic film 48p2, and the side face of the second electrode-side insulating film 43p2 are surfaces parallel to the Z-axis direction.

Each of the plurality of first electrode films 61a and each of the plurality of second electrode films 61b are the same layer. That is, the distance between the substrate 11 and each of the plurality of first electrode films 61a is equal to the distance between the substrate 11 and each of the plurality of second electrode films 61b. The distance between the substrate 11 and each of the plurality of second inter-electrode insulating films 62a is equal to the distance between the substrate 11 and each of the plurality of second inter-electrode insulating films 62b.

In addition, in this specific example, the nonvolatile semiconductor memory device 110 may further include a connection portion conductive layer SCC and a connection portion insulating film 47c1.

The connection portion conductive layer SCC is provided opposite to the connection portion CP (the first connection portion CP1). The connection portion insulating film 47c1 is provided between the connection portion CP and the connection portion conductive layer SCC.

The memory cell transistor is formed at the intersection of the electrode film 61 (the first electrode film 61a and the second electrode film 61b) and the semiconductor layer SP (the first semiconductor layer SP1 and the second semiconductor layer SP2). Each of the memory cell transistors forms the memory cell MC.

A prescribed electric signal is applied to the electrode film 61. The electrode film 61 functions as, for example, a word electrode of the nonvolatile semiconductor memory device 110.

In each of the memory cells MC, the organic film 48 (the first organic film 48p1 and the second organic film 48p2) stores or discharges a charge by an electric potential applied between the semiconductor layer SP and the electrode film 61. The organic film 48 functions as a portion that stores information. The organic film 48 (the first organic film 48p1 and the second organic film 48p2) functions as a charge storage layer.

The semiconductor-side insulating film 42 (the first semiconductor-side insulating film 42p1 and the second semiconductor-side insulating film 42p2) functions as, for example, a tunnel insulating film in each of the memory cells MC.

The electrode-side insulating film 43 (the first electrode-side insulating film 43p1 and the second electrode-side insulating film 43p2) functions as, for example, a block insulating film in each of the memory cells MC.

For example, the first semiconductor layer SP1 and the second semiconductor layer SP2 are electrically connected by the connection portion CP (the first connection portion CP1) due to a voltage applied to the connection portion conductive layer SCC.

Any conductive material may be used for the electrode film 61 (the first electrode film 61a and the second electrode film 61b) and the connection portion conductive layer SCC. Amorphous silicon (noncrystalline silicon) provided with electrical conductivity by introducing an impurity or polysilicon (polycrystalline silicon) provided with electrical conductivity by introducing an impurity, for example, is used for the electrode film 61 and the connection portion conductive layer SCC. Alternatively, a metal, an alloy, and the like are used for the electrode film 61.

Silicon oxide, for example, is used for the inter-electrode insulating film 62 (the first inter-electrode insulating film 62a and the second inter-electrode insulating film 62b). The inter-electrode insulating film 62 may be a single-layer film or a stacked film.

Silicon oxide, for example, is used for the semiconductor-side insulating film 42 (the first semiconductor-side insulating film 42p1 and the second semiconductor-side insulating film 42p2). The semiconductor-side insulating film 42 may be a single-layer film or a stacked film.

Silicon oxide or hafnium oxide, for example, may be used for the electrode-side insulating film 43 (the first electrode-side insulating film 43p1 and the second electrode-side insulating film 43p2). In other words, the electrode-side insulating film 43 may contain a metal oxide such as hafnium oxide. The electrode-side insulating film 43 may contain an organic insulating material.

An organic compound is used for the organic film 48 (the first organic film 48p1 and the second organic film 48p2). The organic film 48 is described later.

As shown in FIG. 3, the nonvolatile semiconductor memory device 110 further includes the first selection gate electrode SG1, the second selection gate electrode SG2, a first interconnection (the bit line BL), and a second interconnection (the source line SL).

The first selection gate electrode SG1 is stacked with the first stacked structure body ML1 in the Z-axis direction. The first selection gate electrode SG1 is penetrated through by the first semiconductor layer SP1.

The second selection gate electrode SG2 is stacked with the second stacked structure body ML2 in the Z-axis direction. The second selection gate electrode SG2 is penetrated through by the second semiconductor layer SP2.

The bit line BL is electrically connected to the other end of the first semiconductor layer SP1 (the end on the side opposite to the connection portion CP, i.e., the first connection portion CP1). The bit line BL is electrically connected to the other end of the first semiconductor layer SP1 via a contact electrode V1.

The source line SL is electrically connected to the other end of the second semiconductor layer SP2 (the end on the side opposite to the connection portion CP, i.e., the first connection portion CP1).

The first electrode film 61a and the second electrode film 61b extend along the Y-axis direction perpendicular to the Z-axis direction and the X-axis direction. For example, the first electrode film 61a and the second electrode film 61b include a portion extending along the Y-axis direction.

The bit line BL extends along the X-axis direction. For example, the bit line BL includes a portion extending along the X-axis direction. The source line SL extends along the Y-axis direction. For example, the source line SL includes a portion extending along the Y-axis direction.

The first selection gate electrode SG1 and the second selection gate electrode SG2 include a portion extending along the Y-axis direction. That is, the first selection gate electrode SG1 and the second selection gate electrode SG2 extend along a direction parallel to the extending direction of the first electrode film 61*a* and the second electrode film 61*b*.

Any conductive material may be used for the selection gate electrode SG (the first selection gate electrode SG1 and the second selection gate electrode SG2). Amorphous silicon provided with electrical conductivity by introducing an impurity or polysilicon provided with electrical conductivity by introducing an impurity, for example, is used for the selection gate electrode SG. Alternatively, a metal, an alloy, and the like are used for the selection gate electrode SG.

A selection gate insulating film SGI is provided between the selection gate electrode SG and the semiconductor layer SP.

That is, the nonvolatile semiconductor memory device 110 may further include a first selection gate insulating film provided between the first selection gate electrode SG1 and the first semiconductor layer SP1 and a second selection gate insulating film provided between the second selection gate electrode SG2 and the second semiconductor layer SP2.

Any insulating material is used for the selection gate insulating film SGI (the first selection gate insulating film and the second selection gate insulating film). The material that forms at least one of the semiconductor-side insulating film 42, the organic film 48, and the electrode-side insulating film 43 may be used. The selection gate insulating film SGI may be a single-layer film or a stacked film.

A first selection gate transistor SGT1 is formed at the intersection of the selection gate electrode SG and the first semiconductor layer SP1, and a second selection gate transistor SGT2 is formed at the intersection of the selection gate electrode SG and the second semiconductor layer SP2. The selection gate insulating film SGI functions as a gate insulating film for these selection gate transistors. These selection gate transistors have the function of selecting the semiconductor layer SP.

As illustrated in FIG. 3, the nonvolatile semiconductor memory device 110 may further include the third semiconductor layer SP3, the fourth semiconductor layer SP4, and the second connection portion CP2.

The third semiconductor layer SP3 penetrates through a third stacked structure body along the Z-axis direction. The fourth semiconductor layer SP4 penetrates through a fourth stacked structure body along the Z-axis direction. The second connection portion CP2 electrically connects one end of the third semiconductor layer SP3 and one end of the fourth semiconductor layer SP4.

As described in regard to FIG. 5, the electrode film 61 penetrated through by the third semiconductor layer SP3 may be continuous with the second electrode film 61*b* penetrated through by the second semiconductor layer SP2. The electrode film 61 penetrated through by the fourth semiconductor layer SP4 may be continuous with the first electrode film 61*a* penetrated through by the first semiconductor layer SP1. The embodiment is not limited thereto, but the semiconductor layers SP may penetrate through different electrode films 61 separately (for example, electrode films 61 divided along the X-axis direction).

The first interconnection (the bit line BL) is further connected to, for example, the other end of the fourth semiconductor layer SP4 on the side opposite to the second connection portion CP2. The second interconnection (the source line SL) is further connected to the other end of the third semiconductor layer SP3 on the side opposite to the second connection portion CP2.

As illustrated in FIG. 3, the fourth semiconductor layer SP4 is connected to the bit line BL by a contact electrode V2.

FIG. 2 is a cross-sectional view taken along line C-C' of FIG. 1.

As shown in FIG. 2, the though hole TH is provided in the electrode film 61, and the first semiconductor layer SP1 is provided in the through hole TH. The first semiconductor-side insulating film 42*p*1 is provided so as to surround the side face of the first semiconductor layer SP1. The first organic film 48*p*1 is provided so as to surround the side face of the first semiconductor-side insulating film 42*p*1. The first electrode-side insulating film 43*p*1 is provided so as to surround the side face of the first organic film 48*p*1. The first electrode film 61*a* is provided so as to surround the side face of the first electrode-side insulating film 43*p*1.

As shown in FIG. 2, the cross-sectional shape of the through hole TH (the cross-sectional shape cut along the X-Y plane) is a shape having a curve (e.g. a circular shape). The cross-sectional shape of the first semiconductor layer SP1 is a shape having a curve (e.g. a circular shape). Thereby, the curvature in the first semiconductor-side insulating film 42*p*1 is higher than the curvature in the first electrode-side insulating film 43*p*1. Thereby, when a voltage is applied between the first semiconductor layer SP1 and the first electrode film 61*a*, the electric field applied to the first semiconductor-side insulating film 42*p*1 is higher than the electric field applied to the first electrode-side insulating film 43*p*1.

By utilizing the difference in the electric field, for example, a desired charge (e.g. an electron) can be effectively injected into the first organic film 48*p*1 via the first semiconductor-side insulating film 42*p*1. Alternatively, for example, a desired charge (e.g. a hole) can be effectively injected into the first organic film 48*p*1 via the first semiconductor-side insulating film 42*p*1.

Here, an operation in which at least one of the injection of an electron into the organic film 48 (e.g. the first organic film 48*p*1) and the extraction of a hole from the organic film 48 (e.g. the first organic film 48*p*1) is performed falls under the write operation.

An operation in which at least one of the injection of a hole into the organic film 48 (e.g. the first organic film 48*p*1) and the extraction of an electron from the organic film 48 (e.g. the first organic film 48*p*1) is performed falls under the erase operation.

That is, the memory cell transistor that forms the memory cell MC has a state where the threshold voltage is low (the erase state) and a state where the threshold voltage is higher than in the state of the threshold voltage being low (the write state). The write operation is an operation in which the threshold voltage of the memory transistor is set in the state of the higher side. The erase operation is an operation in which the threshold voltage of the memory transistor is set in the state of the lower side.

In this way, the operation as a memory is performed in the nonvolatile semiconductor memory device 110.

In the embodiment, the organic film 48 (the first organic film 48*p*1, the second organic film 48*p*2, etc.) is used as a charge storage layer. The organic film 48 is, for example, a monomolecular film. Thereby, the organic film 48 can have a thin thickness (the thickness along a direction perpendicular to the Z-axis direction) while having high insulating properties. Furthermore, the characteristics of the organic film 48 are uniform.

Thus, by using the organic film 48 as a film provided between the semiconductor-side insulating film 42 and the electrode-side insulating film 43, the thickness of the organic film 48 can be thinned. Thereby, the distance between the semiconductor layer SP and the electrode film 61 can be reduced. Thereby, the size of the memory cell MC can be reduced. Furthermore, the memory cells MC are stacked in the Z-axis direction and provided in a matrix configuration in the X-Y plane. Therefore, by reducing the size of one memory cell MC, the size of the whole nonvolatile semiconductor memory device can be reduced. Furthermore, reducing the size of one memory cell MC leads to a large increase in the memory capacity of the nonvolatile semiconductor memory device. According to this embodiment, a nonvolatile semiconductor memory device with increased integration degree can be provided.

The organic film 48 is, for example, a monomolecular film (or a monomolecular layer). The thickness of the organic film 48 is the thickness corresponding to the thickness (length) of one of the molecules contained in the organic film 48. In the organic film 48, for example, the molecules contained in the organic film 48 form lines.

The thickness of the organic film 48 is about one nanometer (nm) to 2 nm. However, the embodiment is not limited thereto. The organic film 48 may have the configuration of a bimolecular layer, for example. Using the organic film 48 provides a thin uniform film.

The organic film 48 may be chemically bonded to at least one of the semiconductor-side insulating film 42 and the electrode-side insulating film 43. Thereby, the organic film 48 is easily configured to be a monomolecular film by the chemical reaction of organic compound with semiconductor-side insulating film.

The organic film 48 and the semiconductor-side insulating film 42 may be chemically bonded by, for example, at least one of ether linkages, silyl ether linkages, ester linkages, thioether linkages, and single bonds, double bonds, and triple bonds between carbon atoms contained in the organic film 48 and atoms contained in the semiconductor-side insulating film 42. The atom that is contained in the semiconductor-side insulating film 42 and is chemically bonded to the carbon atom contained in the organic film 48 is, for example, a metal atom or a semimetal atom. The semimetal atom is, for example, a silicon atom.

The organic film 48 and the electrode-side insulating film 43 may be chemically bonded by, for example, at least one of ether linkages, silyl ether linkages, ester linkages, thioether linkages, and single bonds, double bonds, and triple bonds between carbon atoms contained in the organic film 48 and atoms contained in the electrode-side insulating film 43. The atom that is contained in the electrode-side insulating film 43 and is chemically bonded to the carbon atom contained in the organic film 48 is, for example, a metal atom or a semimetal atom. The semimetal atom is, for example, a silicon atom.

Thereby, a stable thin organic film 48 is easily obtained.

The organic film 48 contains, for example, a redox molecule. The redox molecule is a molecule that can produce an oxidation reaction and a reduction reaction repeatedly and stably. The redox molecule contains, for example, a molecule called a metal complex such as a porphyrin derivative and a metallocene derivative. By using a redox molecule as the organic film 48, the injection of an electron from the semiconductor layer SP into the organic film 48 and the extraction of a hole from the semiconductor layer 48 can be uniformly performed.

Furthermore, in the nonvolatile semiconductor memory device 110 according to this embodiment, since the organic film 48 is used as a film provided between the semiconductor-side insulating film 42 and the electrode-side insulating film 43, also the effect of relaxing stress is provided. That is, in the organic compound (organic molecules) contained in the organic film 48, the possibility is low that the characteristic of retaining a charge changes even if misalignment between molecules occurs. Therefore, the electrical characteristics of the memory cell MC are easily maintained. As a consequence, a stress-resistant element is obtained. Thereby, the element fracture due to being bent can be suppressed. According to the embodiment, high operational stability and high reliability are obtained.

FIG. 6A to FIG. 6D are diagrams illustrating materials used for the nonvolatile semiconductor memory device according to the embodiment.

FIG. 7A to FIG. 7D are diagrams illustrating materials used for the nonvolatile semiconductor memory device according to the embodiment.

Figure 8A:
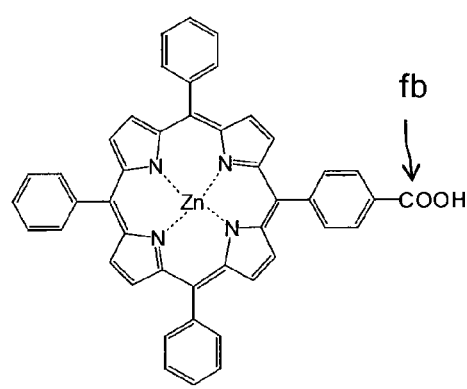
FIG. 8A to FIG. 8C are diagrams illustrating materials used for the nonvolatile semiconductor memory device according to the embodiment.
Figure 8B:
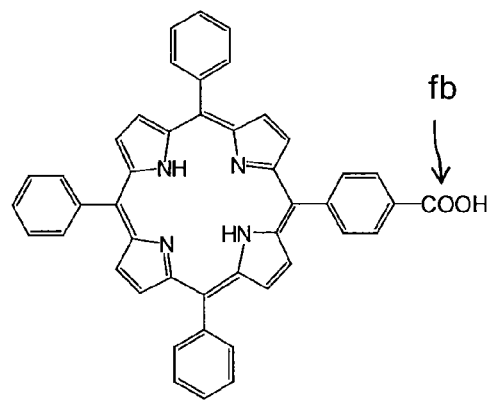
Figure 8C:
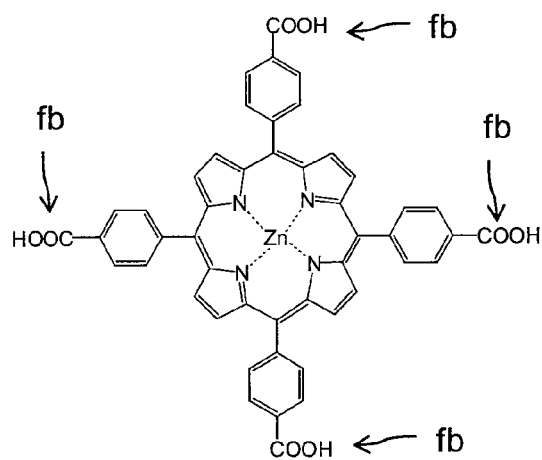
Figure 9A:
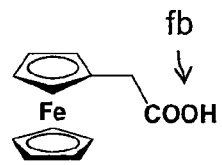
FIG. 9A to FIG. 9D are diagrams illustrating materials used for the nonvolatile semiconductor memory device according to the embodiment.
Figure 9B:
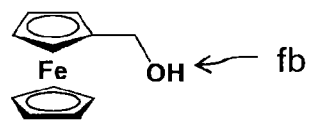
Figure 9C:
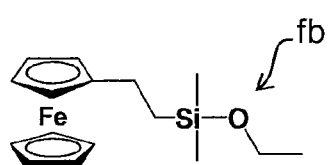
Figure 9D:
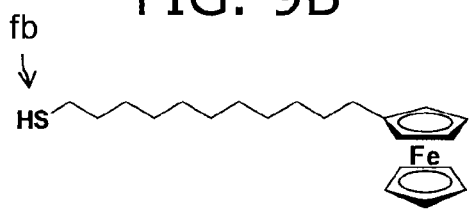

FIG. 8A to FIG. 8C are diagrams illustrating materials used for the nonvolatile semiconductor memory device according to the embodiment.

FIG. 9A to FIG. 9D are diagrams illustrating materials used for the nonvolatile semiconductor memory device according to the embodiment.

Figure 10A:
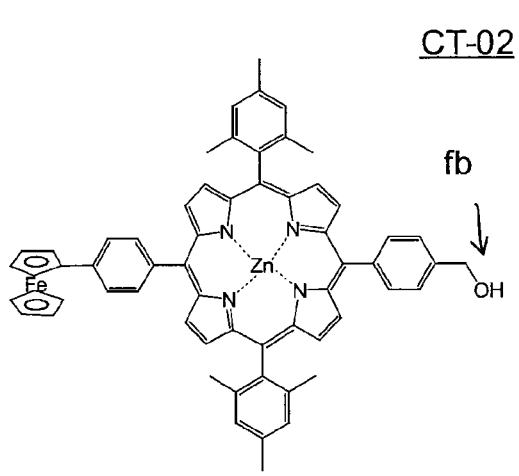
FIG. 10A and FIG. 10B are diagrams illustrating materials used for the nonvolatile semiconductor memory device according to the embodiment.
Figure 10B:
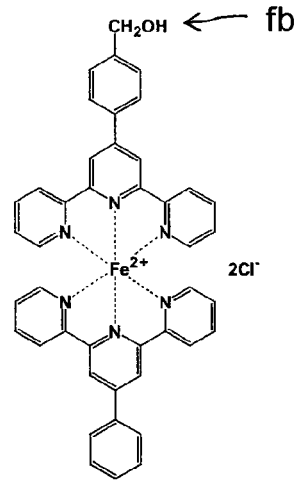

FIG. 10A and FIG. 10B are diagrams illustrating materials used for the nonvolatile semiconductor memory device according to the embodiment.

As shown in FIG. 6A to FIG. 7D, a material having a porphyrin structure in which three trimethylphenyl groups are chemically bonded may be used for the organic film 48.

As shown in FIG. 6A, a material containing a hydroxyl group may be used for the organic film 48. The hydroxyl group is a chemical modifying group fb.

As shown in FIG. 6B, a material containing an alkoxysilyl group may be used for the organic film 48. The alkoxysilyl group is the chemical modifying group fb.

As shown in FIG. 6C, a material containing a carboxyl group may be used for the organic film 48. The carboxyl group is the chemical modifying group fb.

As shown in FIG. 6D, a material containing a thiol group may be used for the organic film 48. The thiol group is the chemical modifying group fb.

Figure 7A:
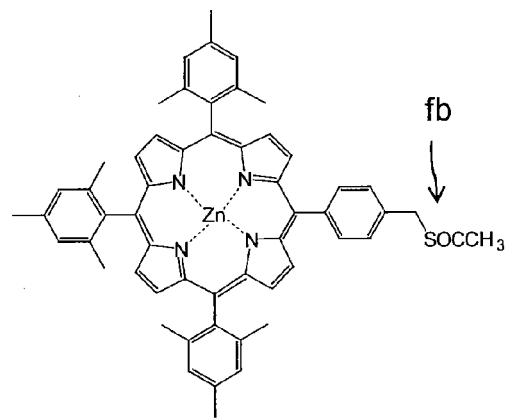
FIG. 7A to FIG. 7D are diagrams illustrating materials used for the nonvolatile semiconductor memory device according to the embodiment.

As shown in FIG. 7A, a material containing a thioacetyl group may be used for the organic film 48. The thioacetyl group is the chemical modifying group fb.

Figure 7B:
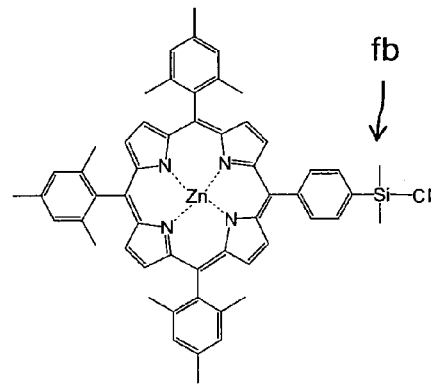

As shown in FIG. 7B, a material containing a chlorosilyl group may be used for the organic film 48. The chlorosilyl group is the chemical modifying group fb.

Figure 7C:
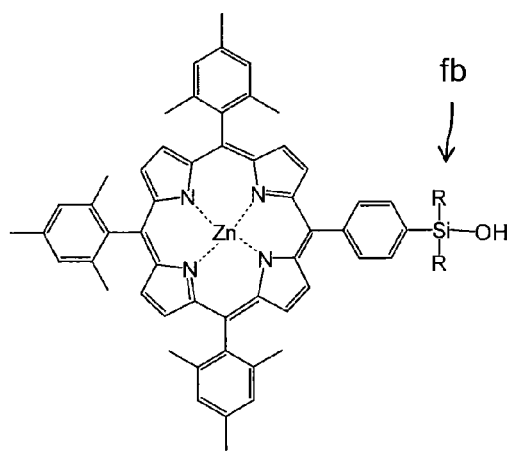

As shown in FIG. 7C, a material containing a silanol group may be used for the organic film 48. The silanol group is the chemical modifying group fb. In FIG. 7C, "R" is a substituent. "R" contains at least one of carbon, hydrogen, and oxygen. "R" is, for example, a methyl group, an ethyl group, a propyl group, or the like. "R" is preferably a linear alkyl group of a saturated hydrocarbon.

Figure 7D:
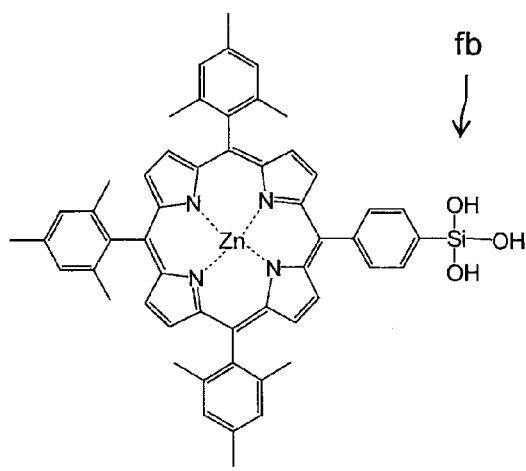

As shown in FIG. 7D, a material containing a trihydroxysilyl group may be used for the organic film 48. The trihydroxysilyl group is the chemical modifying group fb.

Thus, the organic film 48 may contain at least one group selected from the group consisting of a hydroxyl group, a silanol group, an alkoxysilyl group, a chlorosilyl group, a carboxyl group, and a thiol group. The silanol group mentioned above includes, for example, a trihydroxysilyl group.

In the case where the organic film 48 containing a silanol group as the chemical modifying group fb is used, high reactivity is exhibited to a metal oxide such as $SiO_2$ and $HfO_2$, and a dense organic film 48 can be formed. In addition, the silyl ether linkage formed by the reaction of the silanol group with a metal oxide exhibits high thermal stability. It is considered that this configuration is advantageous from the viewpoint of manufacturing processes.

In the case where the silanol group has a structure in which one hydroxyl group is chemically bonded to silicon element, the molecular motion can be made with a high degree of freedom to a metal oxide such as $SiO_2$ and $HfO_2$. This is favorable in that the molecule becomes an optimum structure to the metal oxide.

In the organic film 48 having a trihydroxysilyl group, the binding of one molecule is formed by three silyl ether linkages with a metal oxide such as $SiO_2$ and $HfO_2$. Hence, this is favorable in that the molecular motion is limited, the molecular structure is rigid to the metal oxide, and the molecule remains in the same place.

In the case where the chemical modifying group fb containing a silicon atom is used and the film to which the organic film 48 bonds (one of the semiconductor-side insulating film 42 and the electrode-side insulating film 43) is a $SiO_2$ film, the organic film 48 and one of the semiconductor-side insulating film 42 and the electrode-side insulating film 43 are chemically bonded by linkages containing Si—O—Si.

As shown in FIG. 8A, a material having a porphyrin structure containing no trimethyl group may be used for the organic film 48. Although a carboxyl group is used as the chemical modifying group fb in this specific example, the chemical modifying group fb may be other configurations.

By providing the organic film 48 with the chemical modifying group fb such as the foregoing, the material that forms the organic film 48 bonds to at least one of the semiconductor-side insulating film 42 and the electrode-side insulating film 43. The material bonds to an element contained in at least one of the semiconductor-side insulating film 42 and the electrode-side insulating film 43. Thereby, a stable thin organic film 48 can be formed.

As illustrated in FIG. 6A to FIG. 7D and FIG. 8A, the material used for the organic film 48 contains Zn. Thereby, the amount of charge stored in the organic film 48 can be increased. Thereby, the operation of the nonvolatile semiconductor memory device is stabilized.

The embodiment is not limited thereto, but the material used for the organic film 48 may contain other metal elements. More specifically, the organic film 48 may contain at least one selected from the group consisting of Zn, Cu, Fe, Ru, and Ir. Thereby, the amount of charge stored in the organic film 48 can be increased, and this is more preferable.

The embodiment is not limited thereto, but the organic film 48 may not contain the metal elements mentioned above.

As shown in FIG. 8B, a material not containing the metal elements mentioned above may be used for the organic film 48.

As shown in FIG. 8C, a material containing a plurality of chemical modifying groups fb may be used for the organic film 48. Although a carboxyl group is used as the chemical modifying group fb in this specific example, the chemical modifying group fb may be other configurations.

As mentioned above, a material having a porphyrin structure is preferably used as the organic film 48. That is, the material having a porphyrin structure has a large molecular weight and has a rigid molecular chain. Thereby, the heat resistance of the organic film 48 is increased. By using a material having a porphyrin structure as the organic film 48, stable characteristics are easily obtained. However, the embodiment is not limited thereto.

As shown in FIG. 9A to FIG. 9D, a material having a metallocene structure may be used for the organic film 48. Specifically, for example, a material having a ferrocene structure may be used.

As shown in FIG. 9A to FIG. 9D, materials that have a ferrocene structure and contains a carboxyl group, a hydroxyl group, an alkoxysilyl group, and a thiol group, respectively, as the chemical modifying group fb may be used for the organic film 48. Furthermore, the materials of these examples contain Fe. Thereby, the amount of charge stored in the organic film 48 can be increased.

As shown in FIG. 10A, a material having a structure in which ferrocene and a porphyrin are combined may be used for the organic film 48. Although a hydroxyl group is used as the chemical modifying group fb in this example, the chemical modifying group fb is arbitrary.

As shown in FIG. 10B, a material having a bipyridine structure may be used for the organic film 48. Specifically, a bipyridine complex molecule may be used. Also in this case, the chemical modifying group fb is arbitrary. Furthermore, although Fe is contained in this example, the metal element contained may be other metal elements.

Thus, the organic film 48 may contain at least one of a porphyrin, a metallocene, and a bipyridine. Thereby, a thin film having stable characteristics can be formed.

As described later, the organic film 48 can be formed by, for example, the self-assembly method. That is, a self-assembled monolayer, for example, may be used as the organic film 48.

The semiconductor-side insulating film 42 may contain a metal oxide, for example. The metal oxide may be $HfO_2$ and the like, for example. The chemical modifying group fb contained in the organic film 48 bonds to a metal element of the metal oxide contained in the semiconductor-side insulating film 42. Thus, the organic film 48 may be chemically bonded to an element contained in at least one of the semiconductor-side insulating film 42 and the electrode-side insulating film 43. Thereby, a thin film having stable characteristics can be easily formed.

Hereinbelow, the results of an evaluation of the characteristics of an element corresponding to one of the memory cells MC included in the nonvolatile semiconductor memory device 110 according to the embodiment are described with reference to a reference example.

FIG. 11A and FIG. 11B are schematic cross-sectional views illustrating the configurations of samples corresponding to nonvolatile semiconductor memory devices.

FIG. 11A corresponds to a sample 110t corresponding to the nonvolatile semiconductor memory device 110 according to the embodiment. FIG. 11B corresponds to a sample 119t corresponding to a nonvolatile semiconductor memory device of a reference example.

As shown in FIG. 11A, in the sample 110t, a semiconductor layer SPt is provided on a counter electrode CE, a semiconductor-side insulating film 42t is provided thereon, an organic film 48t is provided thereon, an electrode-side insulating film 43t is provided thereon, and an electrode film 61t is provided thereon.

The counter electrode CE is an Al film. The semiconductor layer SPt is a polysilicon film. The semiconductor-side insulating film 42t is a $SiO_2$ film with a thickness of 3 nm.

A material CT-02 having the structure illustrated in FIG. 10A was used for the organic film 48t. The organic film 48t is a monomolecular film. The electrode-side insulating film 43t is a $SiO_2$ film with a thickness of 5 nm.

The sample 110t was fabricated in the following way.

A $SiO_2$ film was deposited on a polysilicon film (the semiconductor layer SPt) by the ALD (atomic layer deposition) method, and annealing was performed with an RTA (rapid thermal anneal) apparatus. The $SiO_2$ film forms the semiconductor-side insulating film 42t.

The surface of the semiconductor-side insulating film 42t was cleaned, and was immersed in a solution of the material CT-02 to undergo solution heating. Then, the sample is rinsed. Thereby, the organic film 48 is formed. The organic film 48 is chemically bonded to the semiconductor-side insulating film 42t by ether linkages. The organic film 48 is a monomolecular film of porphyrin molecules.

After that, the electrode-side insulating film 43t was formed. The electrode film 61t was formed on the electrode-side insulating film 43t. In this example, a gold film was formed via a mask, and the gold film was used as the electrode film 61t. The counter electrode CE was formed on the back surface of the semiconductor layer SPt. In this example, concentrated hydrofluoric acid treatment was performed on the back surface of the semiconductor layer SPt, then the workpiece was washed with water, and an aluminum film was formed by vapor deposition. The aluminum film forms the counter electrode CE. Thereby, the sample 110t is formed.

As shown in FIG. 11B, the sample 119t has a configuration in which the semiconductor-side insulating film 42t is omitted in the configuration of the sample 110t. The other configuration is similar to that of the sample 110t, and a description is therefore omitted.

In the fabrication of the sample 119t, the formation of the semiconductor-side insulating film 42t is omitted in the fabricating method described in regard to the sample 110t.

In these samples, a voltage was applied between the electrode film 61t and the counter electrode CE, and the capacitance was measured while changing the applied voltage.

FIG. 12A and FIG. 12B are graphs illustrating characteristics of the samples corresponding to the nonvolatile semiconductor memory devices.

FIG. 12A corresponds to the sample 110t. FIG. 12B corresponds to the sample 119t. In the drawings, the horizontal axis is the applied voltage Vb applied between the electrode film 61t and the counter electrode CE. The vertical axis is the capacitance Ct. In the measurement, the characteristics for the process of decreasing the applied voltage Vb (changing from a positive voltage to a negative voltage) and the characteristics for the process of increasing it (changing from a negative voltage to a positive voltage) were evaluated. In the drawings, the circular marks represent the measurement results. The solid lines represent the characteristics obtained by a simulation separately carried out. In this simulation, a calculation was made on the supposition that a certain amount of carriers are stored in the organic layer 48.

As shown in FIG. 12A, in the measurement results of the sample 110t, the capacitance Ct exhibited hysteresis characteristics to the change in the applied voltage Vb. There is a difference of about 1.5 volts (V) between the characteristics when decreasing the applied voltage Vb and the characteristics when increasing it. It is considered that the hysteresis characteristics result from the fact that a charge is stored in the organic layer 48. The measurement results agree well with the simulation results expressed by the solid lines.

Furthermore, in the sample 110t, the capacitance curve having a difference of 1.5 V between the time of decreasing the applied voltage Vb mentioned above and the time of increasing it was kept even after a certain period of time had elapsed. That is, in the sample 110t, a charge can be stored in the organic film 48 and the characteristics (hysteresis characteristics) are nonvolatile.

As shown in FIG. 12B, also in the measurement results of the sample 119t, the capacitance Ct exhibited hysteresis characteristics to the change in the applied voltage Vb. In this case, there is a difference of about 1.8 V between the characteristics when decreasing the applied voltage Vb and the characteristics when increasing it. That is, also in the sample 119t, a charge can be stored in the organic layer 48. However, in the sample 119t, the hysteresis characteristics mentioned above disappeared with time. That is, the characteristics are volatile in the sample 119t.

It is considered that the reason why the characteristics are volatile in the sample 119t is because the semiconductor-side insulating film 42t is not provided in the sample 119t. In the sample 110t, insulating films (the semiconductor-side insulating film 42t and the electrode-side insulating film 43t) are provided on both sides of the organic film 48. Thereby, the nonvolatile characteristics are obtained in the sample 110t.

That is, the configuration of the embodiment can provide a nonvolatile semiconductor memory device.

The organic film 48 may be chemically bonded to the semiconductor-side insulating film 42. The semiconductor-side insulating film 42 preferably contains a metal oxide in particular. Thereby, the chemical modifying group fb contained in the material that forms the organic film 48 and an element of the metal oxide contained in the semiconductor-side insulating film 42 are chemically bonded. Thereby, it becomes easy to form an organic film 48 that has stable characteristics and a stable thin thickness.

The electrode-side insulating film 43 may contain a metal oxide. In particular, the metal oxide used for the electrode-side insulating film 43 preferably contains at least one of silicon oxide and hafnium oxide. Thereby, stable characteristics are easily obtained.

In addition, the electrode-side insulating film 43 may contain an organic insulating material. Thereby, for example, the temperature during the formation of the electrode-side insulating film 43 can be decreased. Thereby, the damage to other components (e.g. the organic film 48 etc.) can be reduced. In particular, the electrode-side insulating film 43 may contain a saturated hydrocarbon containing at least one of a methyl group, an ethyl group, and a propyl group. Thereby, in particular, high insulating properties and high process adaptability can be obtained.

Hereinbelow, an example of the method for manufacturing the nonvolatile semiconductor memory device 110 according to this embodiment is described.

Figure 13A:
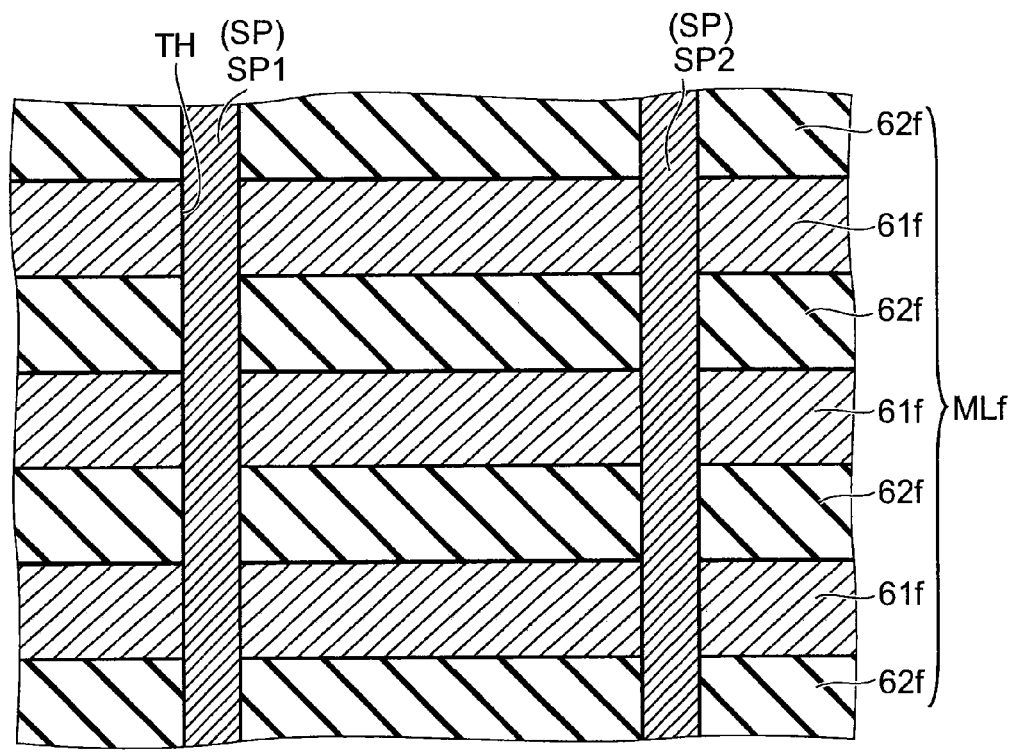
FIG. 13A and FIG. 13B are schematic cross-sectional views in order of the steps, illustrating a method for manufacturing a nonvolatile semiconductor memory device according to the first embodiment.
Figure 13B:
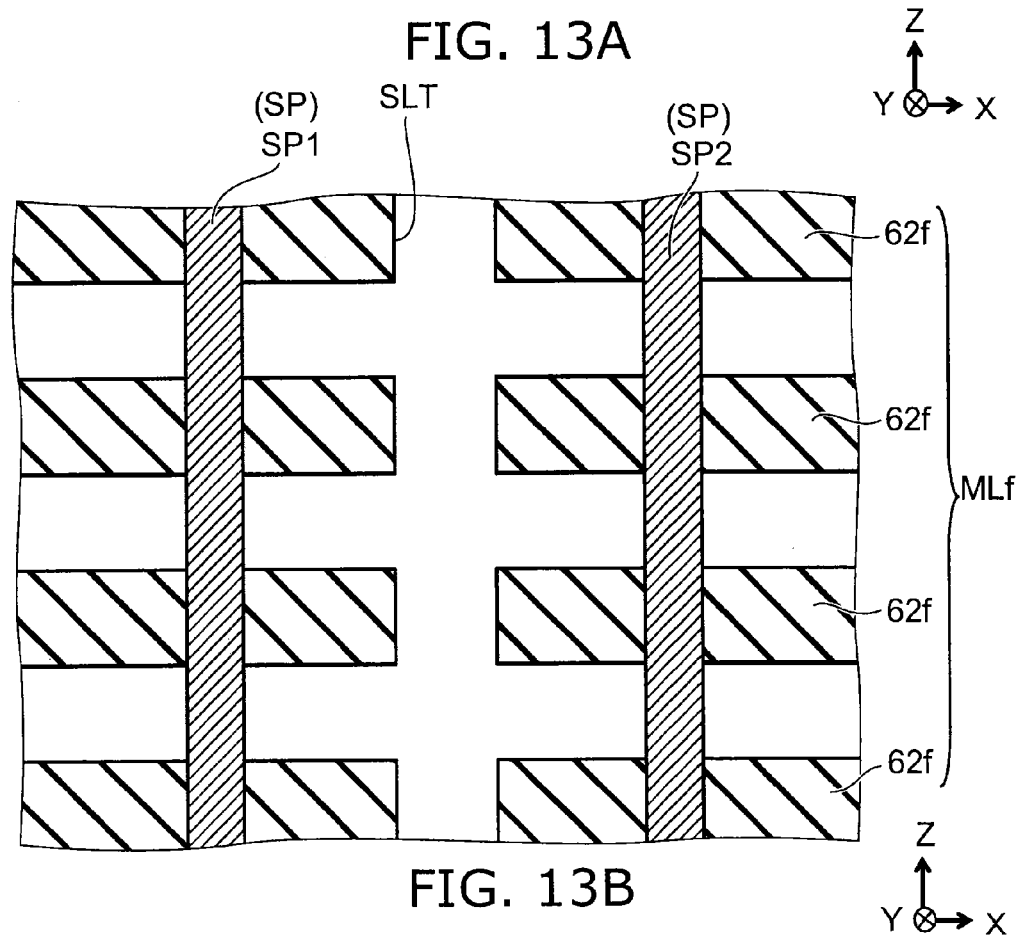

FIG. 13A and FIG. 13B are schematic cross-sectional views in order of the steps, illustrating a method for manufacturing a nonvolatile semiconductor memory device according to the first embodiment.

Figure 14A:
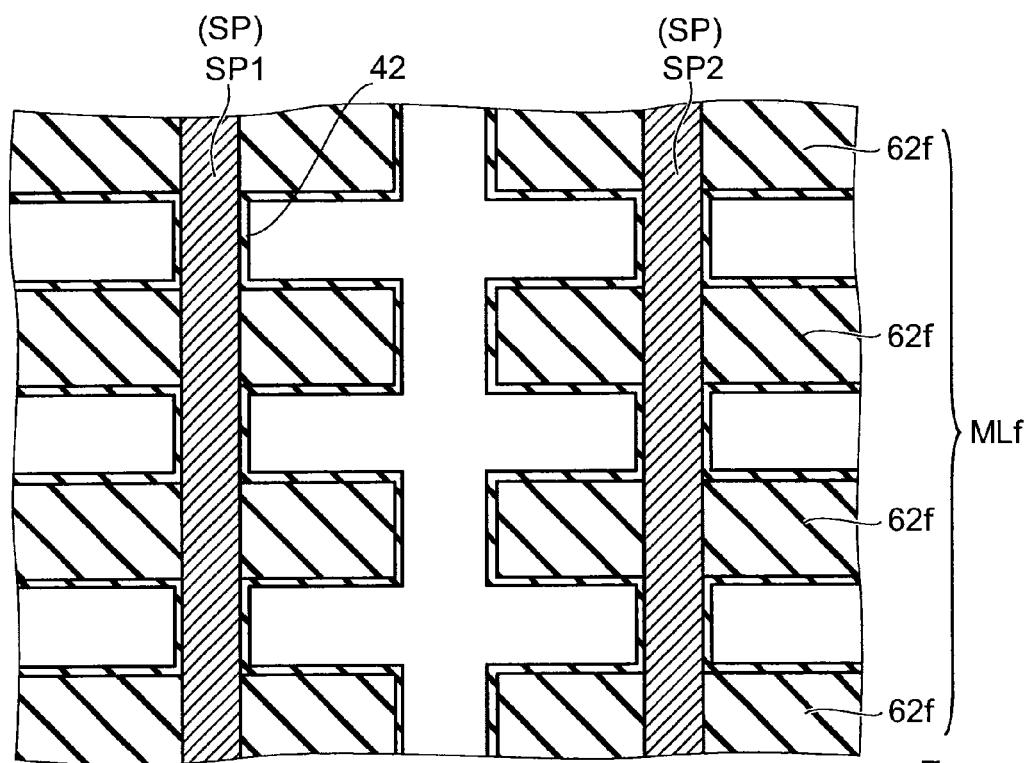
FIG. 14A and FIG. 14B are schematic cross-sectional views in order of the steps, illustrating the method for manufacturing a nonvolatile semiconductor memory device according to the first embodiment.
Figure 14B:
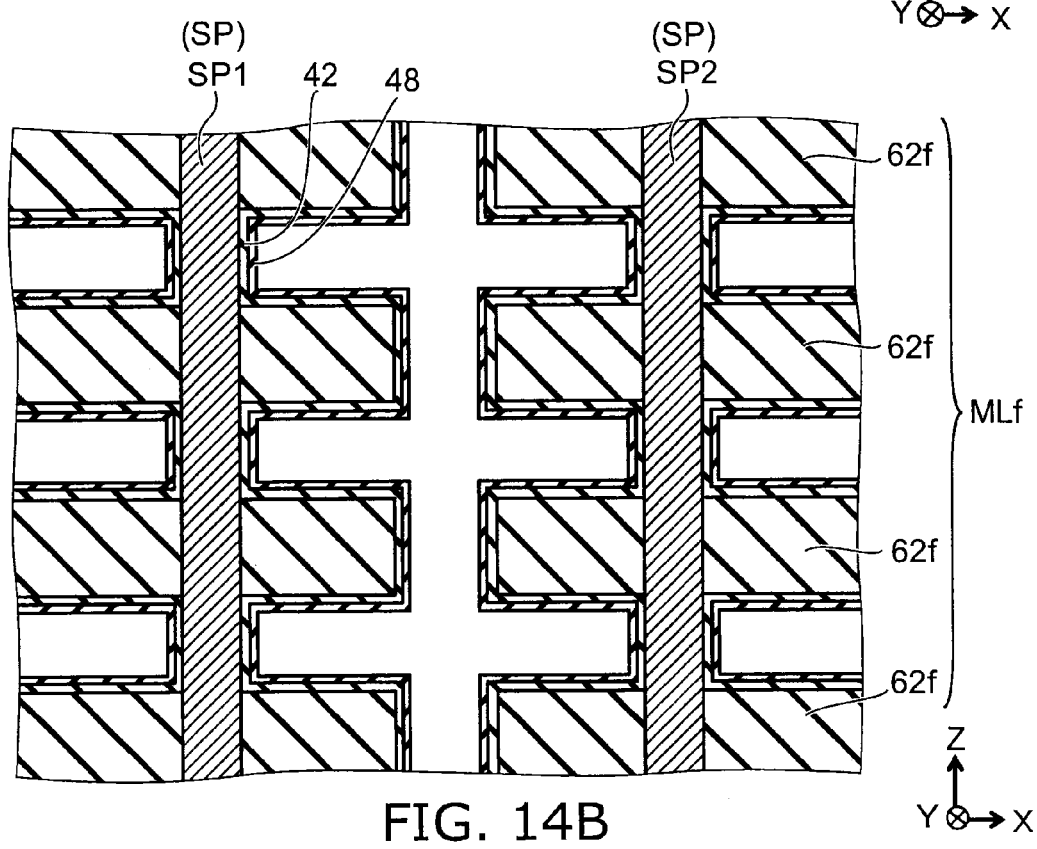

FIG. 14A and FIG. 14B are schematic cross-sectional views in order of the steps, illustrating the method for manufacturing a nonvolatile semiconductor memory device according to the first embodiment.

Figure 15A:
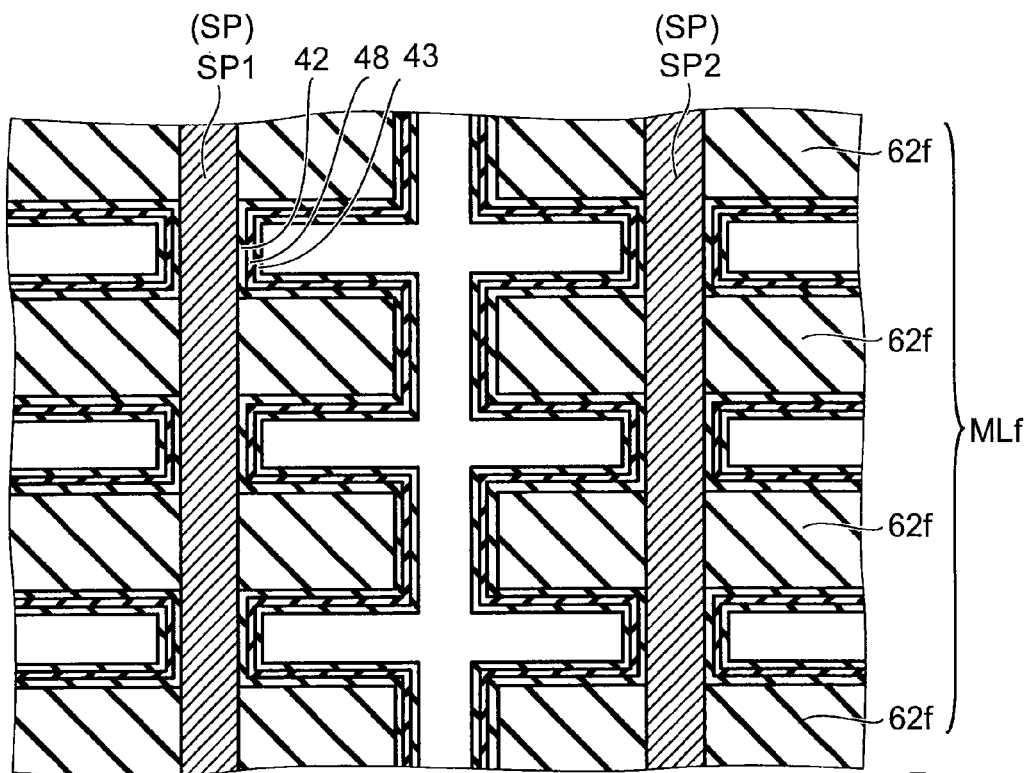
FIG. 15A and FIG. 15B are schematic cross-sectional views in order of the steps, illustrating the method for manufacturing a nonvolatile semiconductor memory device according to the first embodiment.
Figure 15B:
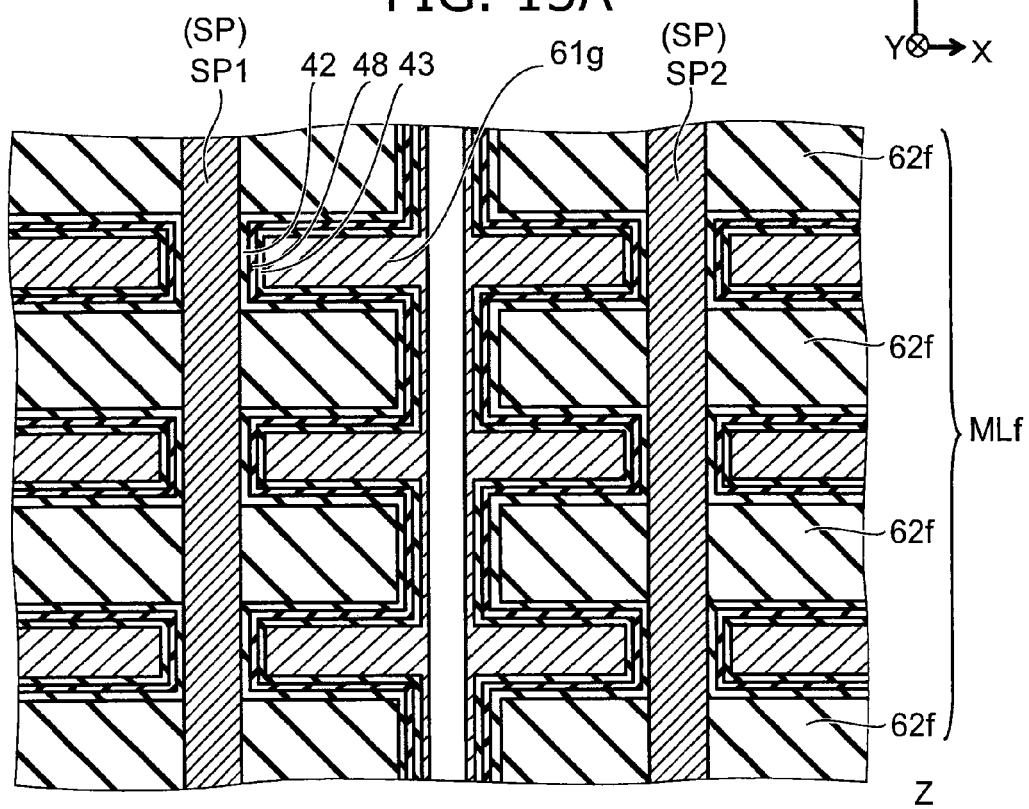

FIG. 15A and FIG. 15B are schematic cross-sectional views in order of the steps, illustrating the method for manufacturing a nonvolatile semiconductor memory device according to the first embodiment.

Figure 16A:
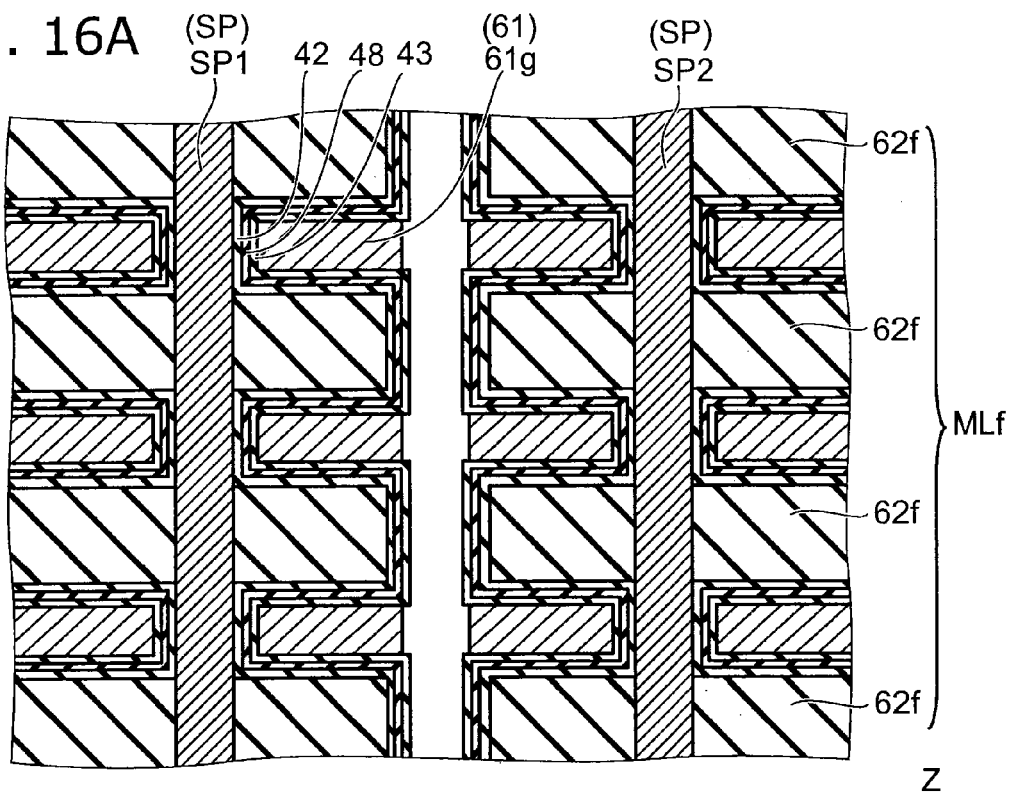
FIG. 16A and FIG. 16B are schematic cross-sectional views in order of the steps, illustrating the method for manufacturing a nonvolatile semiconductor memory device according to the first embodiment.
Figure 16B:
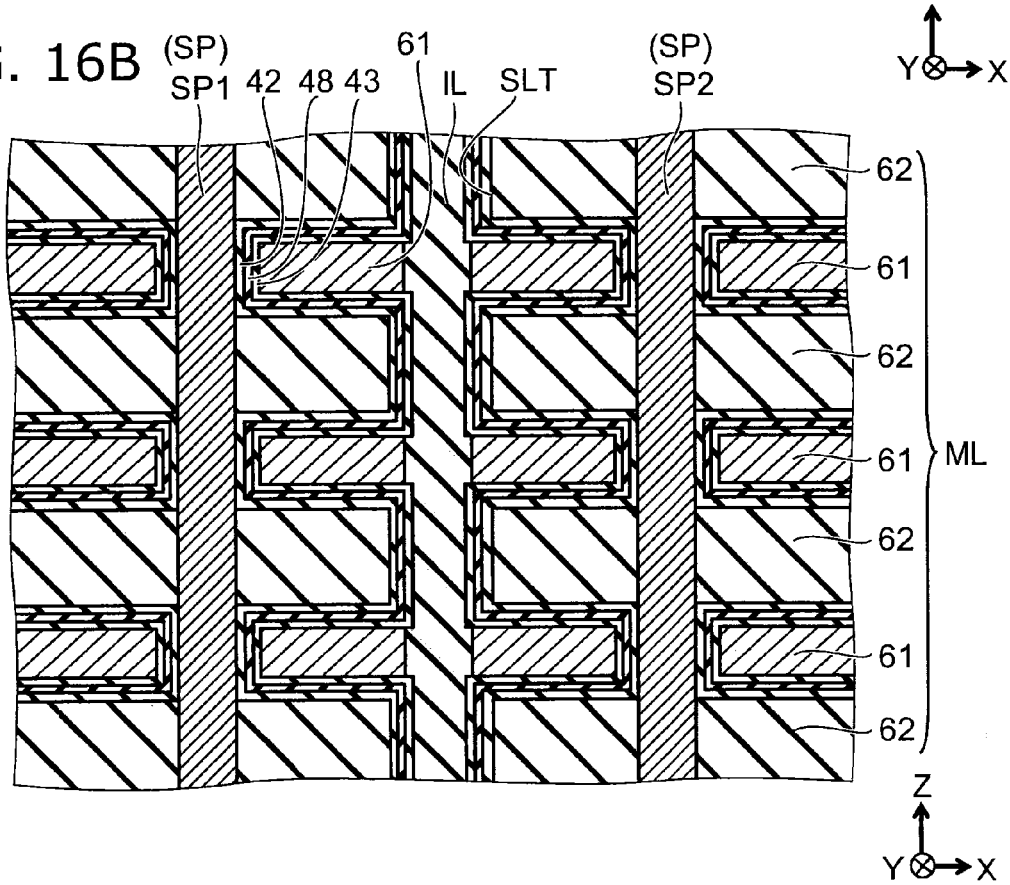

FIG. 16A and FIG. 16B are schematic cross-sectional views in order of the steps, illustrating the method for manufacturing a nonvolatile semiconductor memory device according to the first embodiment.

As shown in FIG. 13A, a plurality of first films 61*f* and a plurality of second films 62*f* are alternately stacked on a substrate (not shown) along the Z-axis direction to form a base stacked body MLf that forms at least part of the stacked structure body ML (e.g. the first stacked structure body ML1 and the second stacked structure body ML2).

The etching rate of the first film 61*f* is different from the etching rate of the second film 62*f*. Amorphous silicon doped with an impurity, for example, is used for the first film 61*f*. Amorphous silicon not doped with an impurity, for example, is used for the second film 62*f*. However, the embodiment is not limited thereto. Any material having an etching rate different from the etching rate of the second film 62*f* may be used for the first film 61*f*.

Further, the through holes TH that penetrate through the base stacked body MLf along the Z-axis direction are formed. Then, a semiconductor is buried in the through hole TH to form the semiconductor layer SP (e.g. the first semiconductor layer SP1 and the second semiconductor layer SP2).

As shown in FIG. 13B, a slit SLT that divides the base stacked body MLf along the Z-axis direction is provided. The slit SLT is, for example, a trench. Then, the plurality of first films 61*f* are removed via the slit SLT. At this time, the second films 62*f* are not removed. That is, the plurality of first films 61*f* are selectively removed.

As shown in FIG. 14A, an insulating film is formed on the side face of the semiconductor layer SP (e.g. the first semiconductor layer SP1, the second semiconductor layer SP2, etc.) exposed by the removal of the plurality of first films 61*f* to form the semiconductor-side insulating film 42. The ALD method or the like, for example, is used for the formation of the insulating film.

As shown in FIG. 14B, the organic film 48 (e.g. the first organic film 48*p*1 and the second organic film 48*p*2) is formed on the semiconductor-side insulating film 42. The self-assembly method, for example, is used for the formation of the organic film 48. That is, the formation of the organic film 48 includes processing using the self-assembly method.

As shown in FIG. 15A, the electrode-side insulating film 43 is formed on the organic film 48.

As shown in FIG. 15B, a conductive film 61*g* is formed on the electrode-side insulating film 43. Amorphous silicon doped with an impurity, for example, is used for the conductive film 61*g*.

As shown in FIG. 16A, the conductive film 61*g* is recessed. Thereby, the conductive film 61*g* is divided along the Z-axis direction. Thereby, the plurality of first electrode films 61 are formed.

As shown in FIG. 16B, an insulating material is buried in the remaining space of the slit SLT to form the insulating layer IL.

Thereby, the nonvolatile semiconductor memory device 110 is formed.

The embodiment includes the method for manufacturing a nonvolatile semiconductor memory device. This manufacturing method is a method for manufacturing a nonvolatile semiconductor memory device that includes the first stacked structure body ML1 (the stacked structure body ML) including the plurality of first electrode films 61*a* (the electrode films 61) stacked along the Z-axis direction and the first inter-electrode insulating films 62*a* (the inter-electrode insulating films 62) provided between the plurality of first electrode films 61*a*, the first semiconductor layer SP1 (the semiconductor layer SP) opposed to the side faces of the plurality of first electrode films 61*a*, the first organic films 48*p*1 (the organic films 48) provided between the side faces of the plurality of first electrode films 61*a* and the first semiconductor layer SP1, the first semiconductor-side insulating films 42*p*1 (the semiconductor-side insulating films 42) provided between the first organic films 48*p*1 and the first semiconductor layer SP1, and the first electrode-side insulating films 43*p*1 (the electrode-side insulating films 43) provided between the first organic films 48*p*1 and the side faces of the plurality of first electrode films 61*a*.

Figure 17:
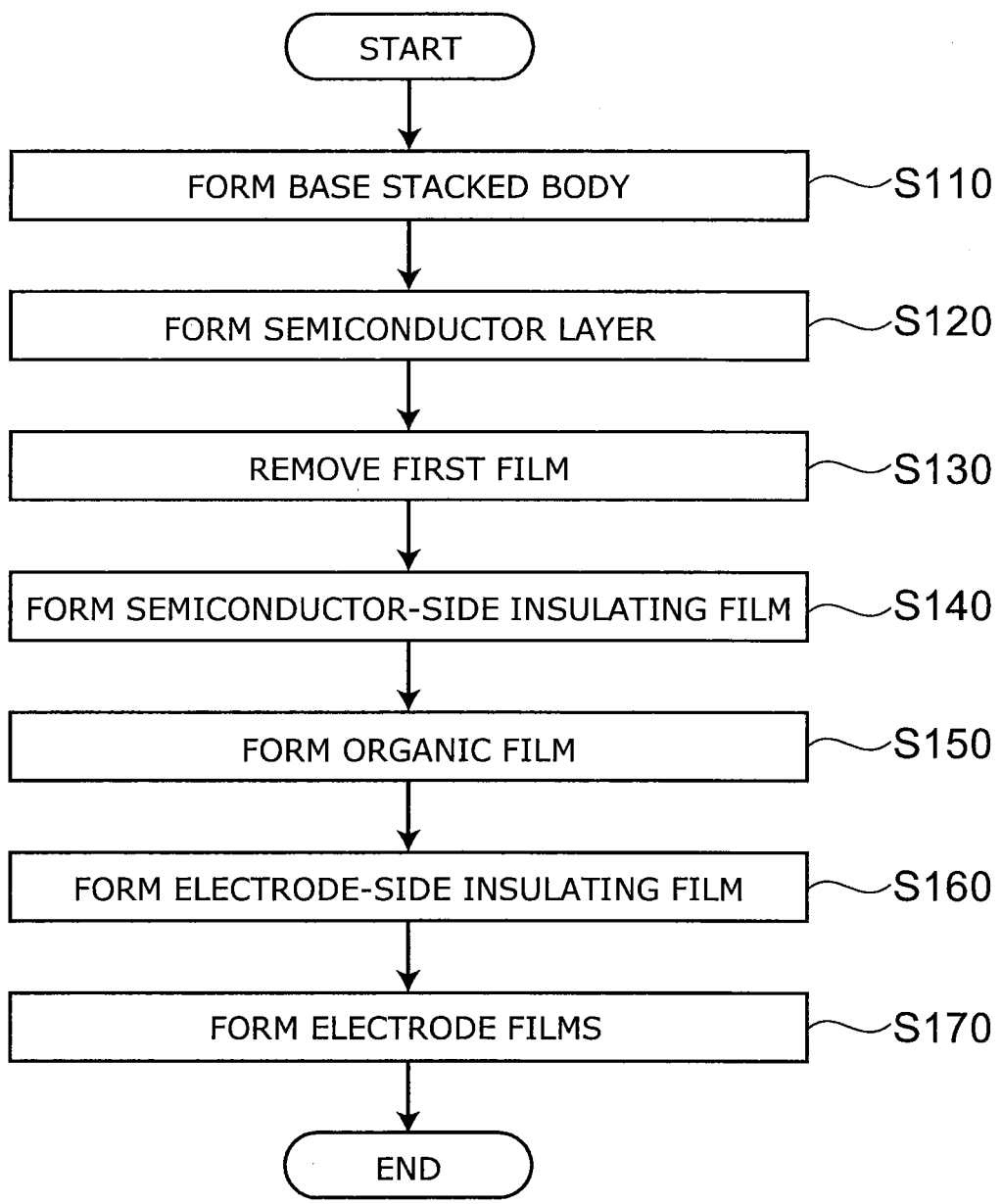
FIG. 17 is a flow chart illustrating a method for manufacturing a nonvolatile semiconductor memory device according to the first embodiment.

FIG. 17 is a flow chart illustrating a method for manufacturing a nonvolatile semiconductor memory device according to the first embodiment.

In this manufacturing method, the plurality of first films 61*f* and the plurality of second films 62*f* are alternately stacked along the Z-axis direction to form the base stacked body MLf that forms at least part of the first stacked structure body ML1 (step S110).

The through holes TH that penetrate through the base stacked body MLf along the Z-axis direction are formed, and a semiconductor is buried in the through hole TH to form the first semiconductor layer SP1 (step S120).

The plurality of first films 61*f* are removed (step S130).

An insulating film is formed on the side face of the first semiconductor layer SP1 exposed by the removal of the plurality of first films 61*f* to form the first semiconductor-side insulating film 42*p*1 (step S140).

The first organic film 48*p*1 is formed on the first semiconductor-side insulating film 42*p*1 (step S150).

The first electrode-side insulating film 43*p*1 is formed on the first organic film 48*p*1 (step S160).

A conductive film is formed on the first electrode-side insulating film 43*p*1 to form the plurality of first electrode films 61*a* (step S170). In step S170, the conductive film is recessed as necessary after the formation of the conductive film. That is, the formation of the plurality of first electrode films 61*a* may include recessing the conductive film.

Thus, this manufacturing method include, for example, performing the processing described in regard to FIG. 13A to FIG. 16B. Thereby, the nonvolatile semiconductor memory device 110 according to this embodiment can be manufactured.

In this manufacturing method, in the case where the organic film 48 is formed by the self-assembly method, a material containing at least one group selected from the group consisting of a hydroxyl group, a silanol group, an alkoxysilyl group, a chlorosilyl group, a carboxyl group, and a thiol group may be used. Furthermore, a material containing at least one selected from the group consisting of Zn, Cu, Fe, Ru, and Ir may be used for the formation of the organic film 48. A material containing at least one of a porphyrin, a metallocene, and a bipyridine may be used for the formation of the organic film 48.

In the self-assembly method in the formation of the organic film 48, the chemical modifying group fb contained in the organic film 48 may be chemically bonded to an element(s) including at least one of Si, Ti, W, and Au. For example, the film (e.g. the semiconductor-side insulating film 42, the electrode-side insulating film 43, etc.) that forms the underlayer of the organic film 48 may contain, for example, at least one of Si, Ti, W, and Au. Furthermore, a layer containing at least one of Si, Ti, W, and Au may be formed on the film (e.g. the film on the semiconductor-side insulating film 42, the electrode-side insulating film 43, etc.) that forms the underlayer of the organic film 48.

The resistance between the semiconductor layer SP and the organic film 48 is preferably high. Further, the resistance between the electrode film 61 and the organic film 48 is preferably high. Thereby, the possibility is reduced that the state of the charge stored in the organic film 48 changes, and stable memory operation can be performed. Therefore, in the configuration in which the chemical modifying group fb contained in the organic film 48 is chemically bonded to an element(s) including at least one of Si, Ti, W, and Au, the conditions for the configuration are designed so that the resistance between the semiconductor layer SP and the organic film 48 and the resistance between the electrode film 61 and the organic film 48 may be high.

The chemical modifying group fb contained in the organic film 48 may be chemically bonded to a metal compound(s) including at least one of $SiO_2$ and $WO_3$.

In the formation of the organic layer 48, for example, the film (e.g. the semiconductor-side insulating film 42, the electrode-side insulating film 43, etc.) that forms the underlayer of the organic film 48 is treated with a solution containing the material that forms the organic film 48.

In the case where the material that forms the organic layer 48 contains a hydroxyl group, ether linkages with an element(s) existing at the surface of the film that forms the underlayer are formed. Thereby, the organic film 48 is formed.

In the case where, for example, the material that forms the organic film 48 contains a carboxyl group, a monomolecular film is obtained of porphyrin molecules chemically bonded to an element(s) existing at the surface of the film that forms the underlayer via carboxylate linkages.

In the case where, for example, the material that forms the organic film 48 contains an ethoxysilyl group, a monomolecular film is obtained of porphyrin molecules chemically bonded to an element(s) existing at the surface of the film that forms the underlayer via silyl ether linkages.

On the other hand, in the case where the electrode-side insulating film 43 is formed on the organic film 48, in the formation of the electrode-side insulating film 43, a $SiO_2$ film or a $HfO_2$ film that forms the electrode-side insulating film 43 is formed on the organic film 48. Then, the film is annealed with an RTA apparatus. Thereby, the electrode-side insulating film 43 is formed.

In the embodiment, the organic film 48 is not limited to the monolayer formed by the self-assembly method. The organic film 48 may include a composite of monolayer, for example. The organic film 48 may include a bulk material, for example.

Second Embodiment

Figure 18:
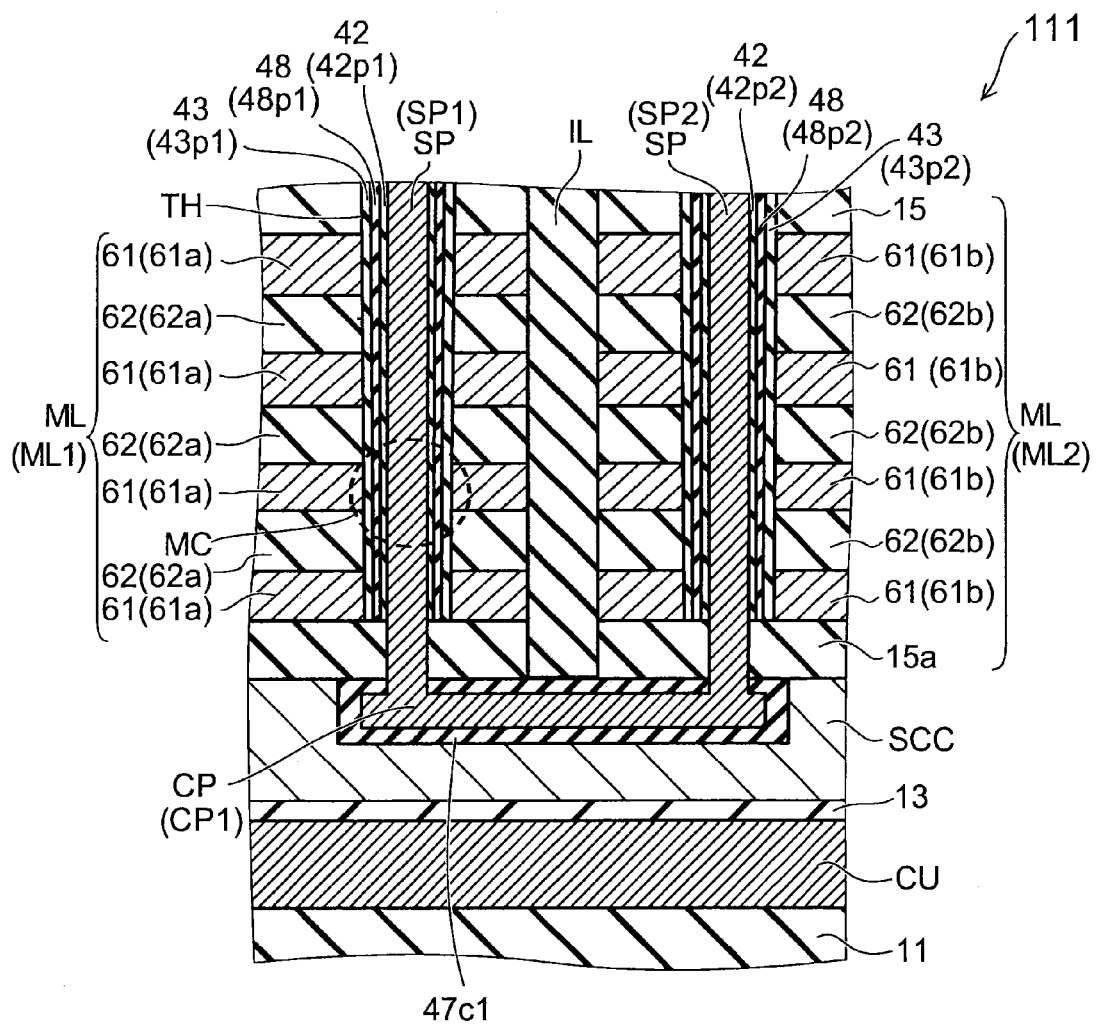
FIG. 18 is a schematic cross-sectional view illustrating the configuration of a nonvolatile semiconductor memory device according to a second embodiment.

FIG. 18 is a schematic cross-sectional view illustrating the configuration of a nonvolatile semiconductor memory device according to a second embodiment.

As shown in FIG. 18, in a nonvolatile semiconductor memory device 111 according to this embodiment, the first semiconductor-side insulating film 42p1 extends between the first semiconductor layer SP1 and the first inter-electrode insulating films 62a. The first organic film 48p1 extends between the first semiconductor-side insulating film 42p1 and the first inter-electrode insulating films 62a. The first electrode-side insulating film 43p1 extends between the first organic film 48p1 and the first inter-electrode insulating films 62a.

Furthermore, the second semiconductor-side insulating film 42p2 extends between the second semiconductor layer SP2 and the second inter-electrode insulating films 62b. The second organic film 48p2 extends between the second semiconductor-side insulating film 42p2 and the second inter-electrode insulating films 62b. The second electrode-side insulating film 43p2 extends between the second organic film 48p2 and the second inter-electrode insulating films 62b.

Thus, the semiconductor-side insulating film 42, the organic film 48, and the electrode-side insulating film 43 may extend along the Z-axis direction between the plurality of memory cells MC stacked along the Z-axis direction.

Figure 19A:
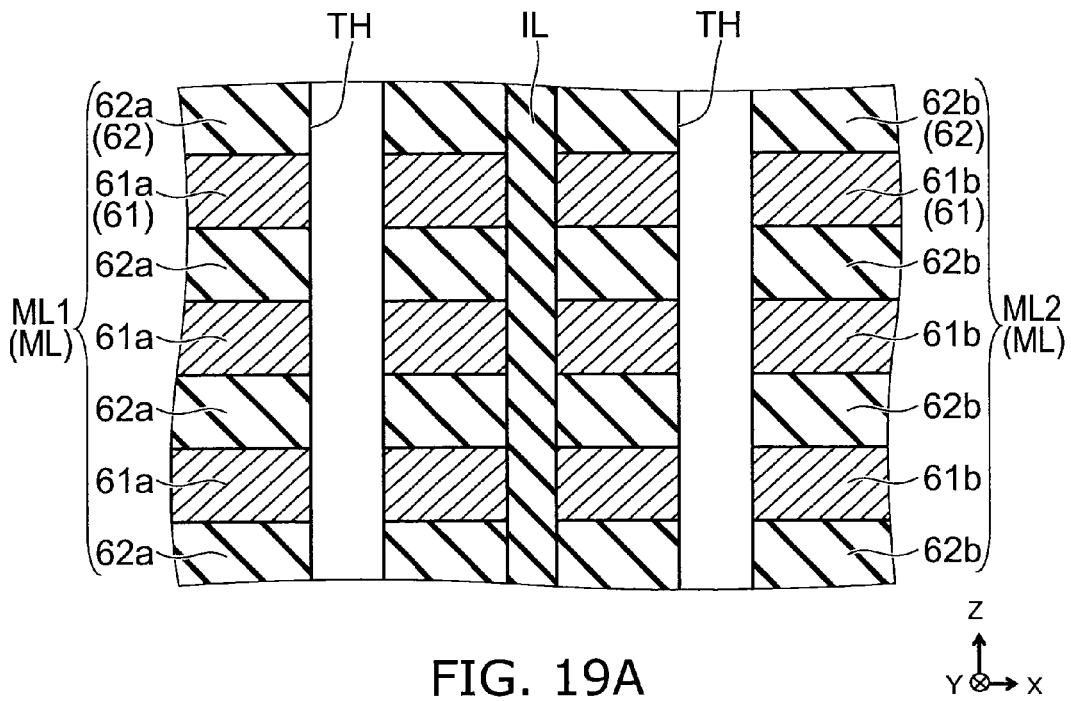
FIG. 19A and FIG. 19B are schematic cross-sectional views in order of the steps, illustrating a method for manufacturing a nonvolatile semiconductor memory device according to the second embodiment.
Figure 19B:
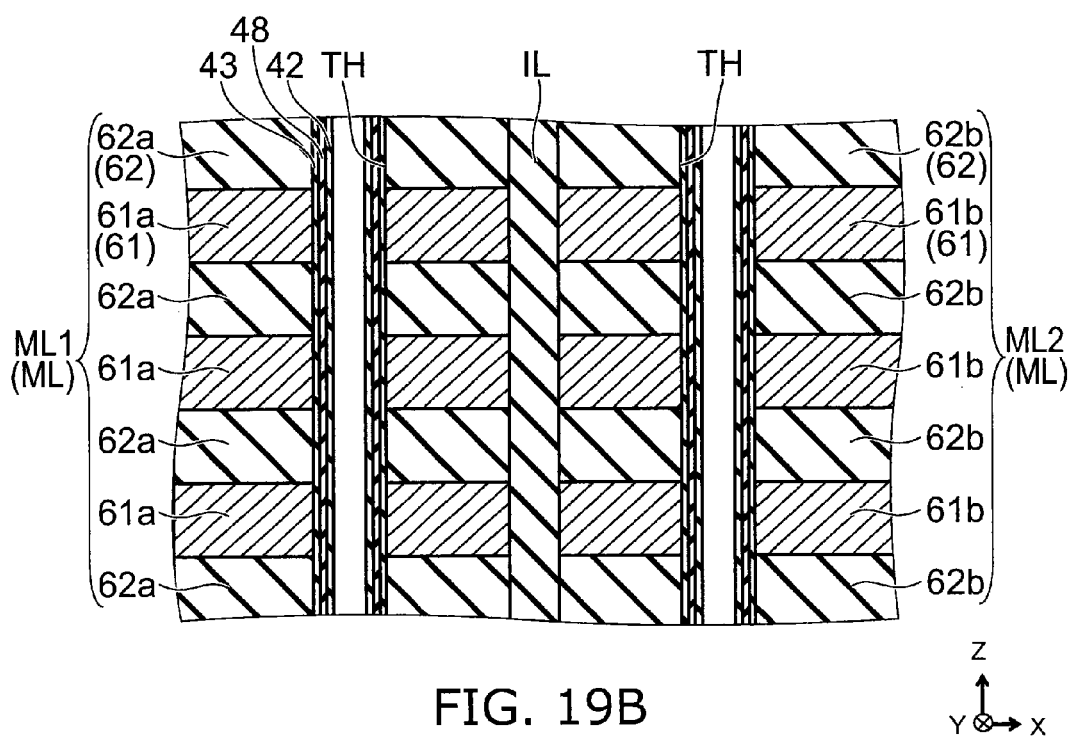

FIG. 19A and FIG. 19B are schematic cross-sectional views in order of the steps, illustrating a method for manufacturing a nonvolatile semiconductor memory device according to the second embodiment.

Figure 20:
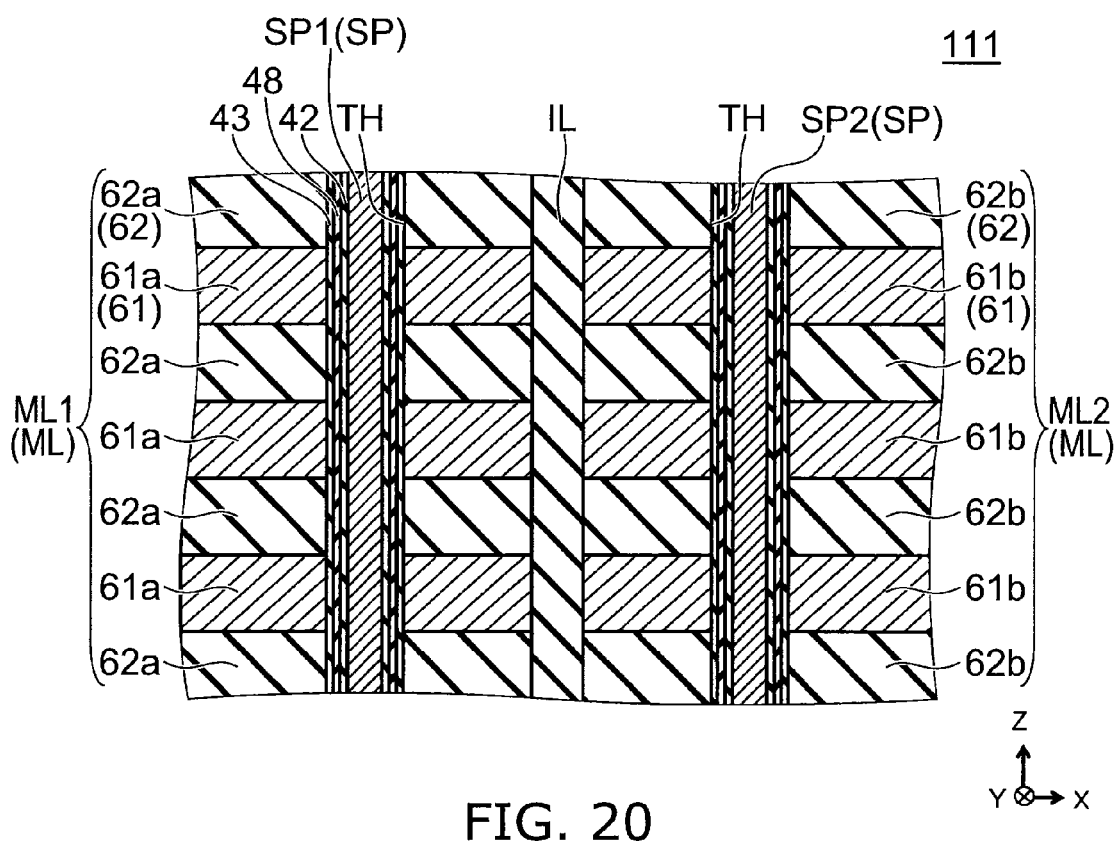
FIG. 20 is a schematic cross-sectional view in order of the steps, illustrating the method for manufacturing a nonvolatile semiconductor memory device according to the second embodiment.

FIG. 20 is a schematic cross-sectional view in order of the steps, illustrating the method for manufacturing a nonvolatile semiconductor memory device according to the second embodiment.

As shown in FIG. 19A, the stacked structure body ML is formed. In this example, the insulating layer IL that divides the first stacked structure body ML1 and the second stacked structure body ML2 is formed.

Then, the through holes TH that penetrate through the stacked structure body ML along the Z-axis direction are formed.

As shown in FIG. 19B, an insulating layer is formed on the inner wall surface of the through hole TH to form the electrode-side insulating film 43.

Then, the organic film 48 is formed on the electrode-side insulating film 43 by the self-assembly method.

Then, the semiconductor-side insulating film 42 is formed on the organic film 48.

As shown in FIG. 20, a semiconductor is buried in the remaining space of the through hole TH to form the semiconductor layer SP.

Thereby, the nonvolatile semiconductor memory device 111 according to this embodiment is formed.

In this configuration, the organic film 48 is chemically bonded to, for example, the electrode-side insulating film 43.

Third Embodiment

Figure 21:
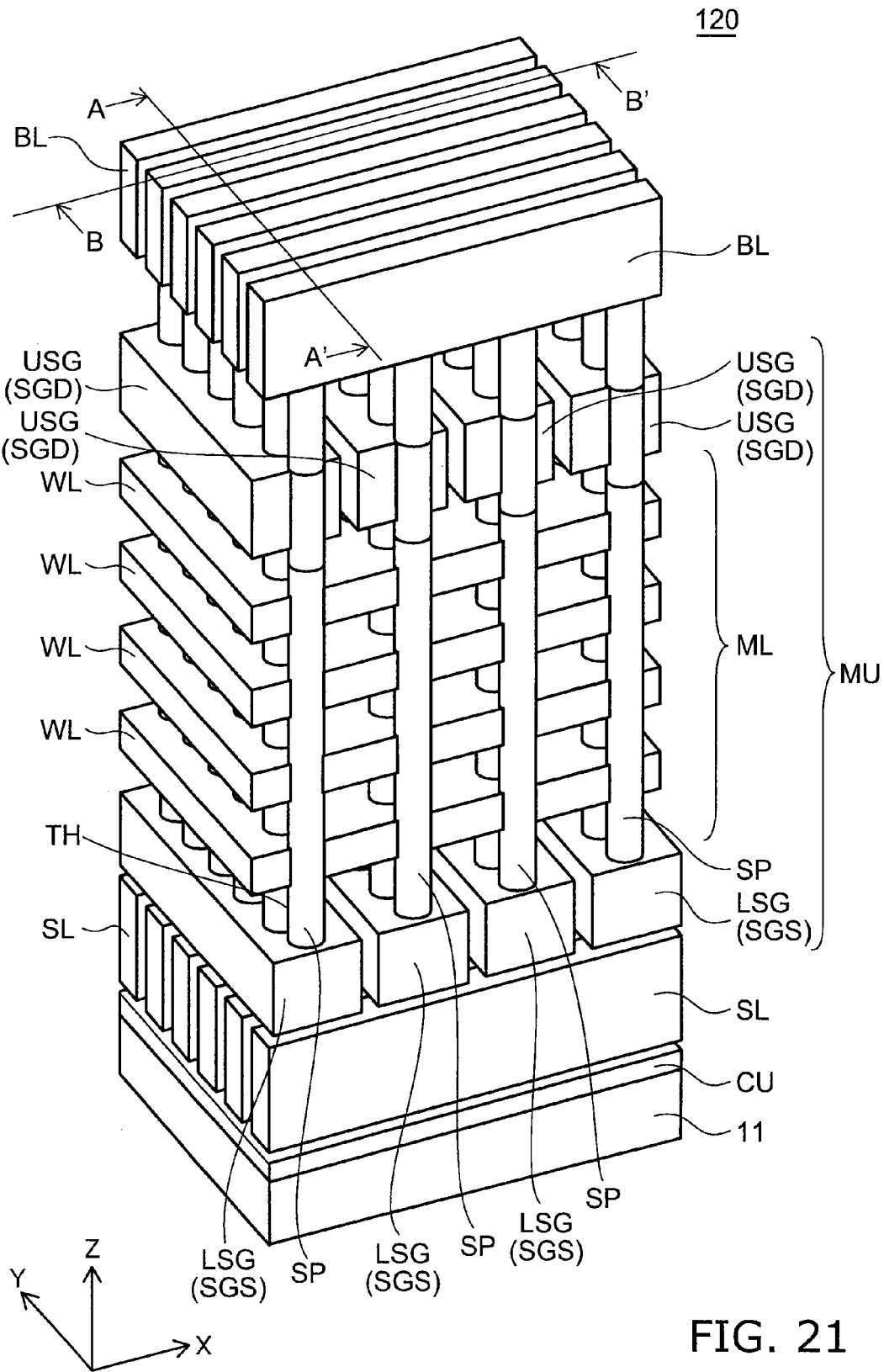
FIG. 21 is a schematic perspective view illustrating the configuration of a nonvolatile semiconductor memory device according to a third embodiment.

FIG. 21 is a schematic perspective view illustrating the configuration of a nonvolatile semiconductor memory device according to a third embodiment.

In FIG. 21, for easier viewing of the drawing, only conductive portions are shown and illustration of the insulating portions is omitted.

Figure 22:
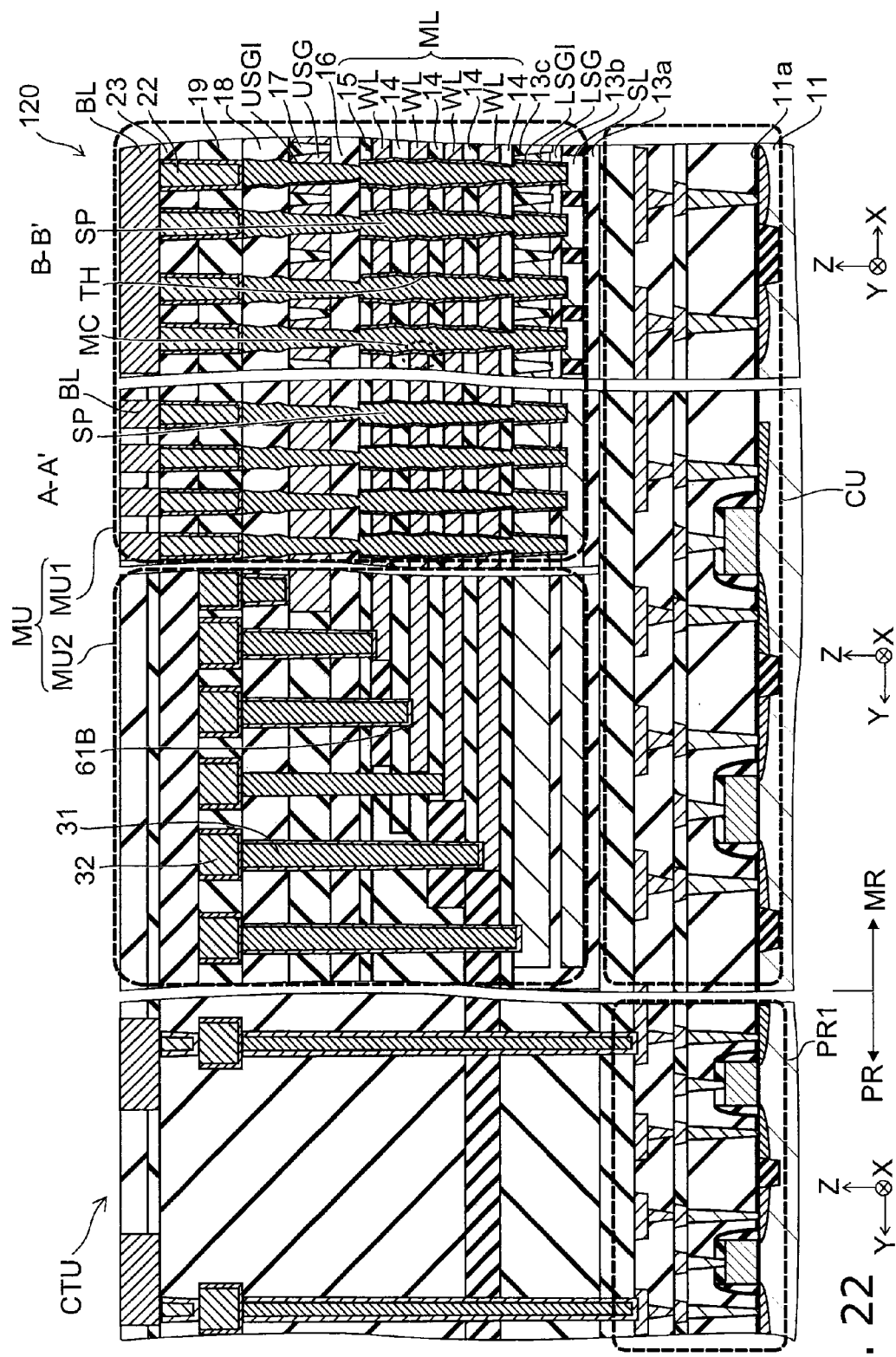
FIG. 22 is a schematic cross-sectional view illustrating the configuration of the nonvolatile semiconductor memory device according to the third embodiment.

FIG. 22 is a schematic cross-sectional view illustrating the configuration of the nonvolatile semiconductor memory device according to the third embodiment.

More specifically, in FIG. 22, a portion of the cross section along line A-A' of FIG. 21 and a portion of the cross section along line B-B' of FIG. 21 are illustrated as the base memory cell unit MU1.

As shown in FIG. 21 and FIG. 22, in a nonvolatile semiconductor memory device 120 according to this embodiment, the connection portion CP is not provided, and each of the semiconductor layers SP are independent. That is, in the nonvolatile semiconductor memory device 120, rectilinear NAND strings are provided.

The nonvolatile semiconductor memory device 120 includes, although not shown, the stacked structure body ML (the first stacked structure body ML1), the semiconductor layer SP (the first semiconductor layer SP1), the semiconductor-side insulating film 42 (the first semiconductor-side insulating film 42p1), the organic film 48 (the first organic film 48p1), and the electrode-side insulating film 43

(the first electrode-side insulating film 43p1), similarly to the first and second embodiments. The configuration of them may be similar to that of the first and second embodiments and a description is therefore omitted.

As shown in FIG. 21, in the memory unit MU of the nonvolatile semiconductor memory device 120, an upper selection gate electrode USG (being the first selection gate electrode SG1 and serving as, for example, a drain-side selection gate electrode SGD) is provided on the stacked structure body ML. A lower selection gate electrode LSG (being the second selection gate electrode SG2 and serving as, for example, a source-side selection gate electrode SGS) is provided under the stacked structure body ML.

That is, the nonvolatile semiconductor memory device 120 further includes the first selection gate electrode SG1 (the upper selection gate electrode USG) and the second selection gate electrode SG2 (the lower selection gate electrode LSG). The first selection gate electrode SG1 is stacked with the first stacked structure body ML1 in the Z-axis direction. The first selection gate electrode SG1 is penetrated through by the first semiconductor layer SP1. The second selection gate electrode SG2 is stacked with the first stacked structure body ML1 in the Z-axis direction. The second selection gate electrode SG2 is penetrated through by the first semiconductor layer SP1. The first stacked structure body ML1 is provided between the first selection gate electrode SG1 and the second selection gate electrode SG2.

An upper selection gate insulating film USGI is provided between the upper selection gate electrode USG and the semiconductor layer SP. A lower selection gate insulating film LSGI is provided between the lower selection gate electrode LSG and the semiconductor layer SP.

The source line SL (e.g. the second interconnection) is provided on the lower side of the lower selection gate electrode LSG. An interlayer insulating film 13a is provided under the source line SL, and an interlayer insulating film 13b is provided between the source line SL and the lower selection gate electrode LSG.

The semiconductor layer SP is connected to the source line SL on the lower side of the lower selection gate electrode LSG. The semiconductor layer SP is connected to the bit line BL (e.g. the first interconnection) on the upper side of the upper selection gate electrode USG. The memory cells MC are formed in the stacked structure body ML between the upper selection gate electrode USG and the lower selection gate electrode LSG. The semiconductor layer SP functions as one rectilinear memory string.

The upper selection gate electrode USG is divided in the X-axis direction by the interlayer insulating film 17. The upper selection gate electrode USG has a strip shape extending along the Y-axis direction. The lower selection gate electrode LSG is divided in the X-axis direction by an interlayer insulating film 13c. The lower selection gate electrode LSG has a strip shape extending along the Y-axis direction.

On the other hand, the bit line BL connected to the upper portion of the semiconductor layer SP has a strip shape extending along the X-axis direction. The source line SL connected to the lower portion of the semiconductor layer SP has a strip shape extending in the X-axis direction.

In the nonvolatile semiconductor memory device 120, the electrode film 61 is a plate-like conductive film parallel to the X-Y plane.

Also in the nonvolatile semiconductor memory device 120 having such a structure, the configuration described in regard to the first embodiment is applied to the organic film 48. That is, a monomolecular film, for example, may be used for the organic film 48.

Also in this embodiment, by using the organic film 48 as a film provided between the semiconductor-side insulating film 42 and the electrode-side insulating film 43, the thickness of the organic film 48 can be thinned. Thereby, a nonvolatile semiconductor memory device with increased integration degree can be provided.

Fourth Embodiment

Figure 23:
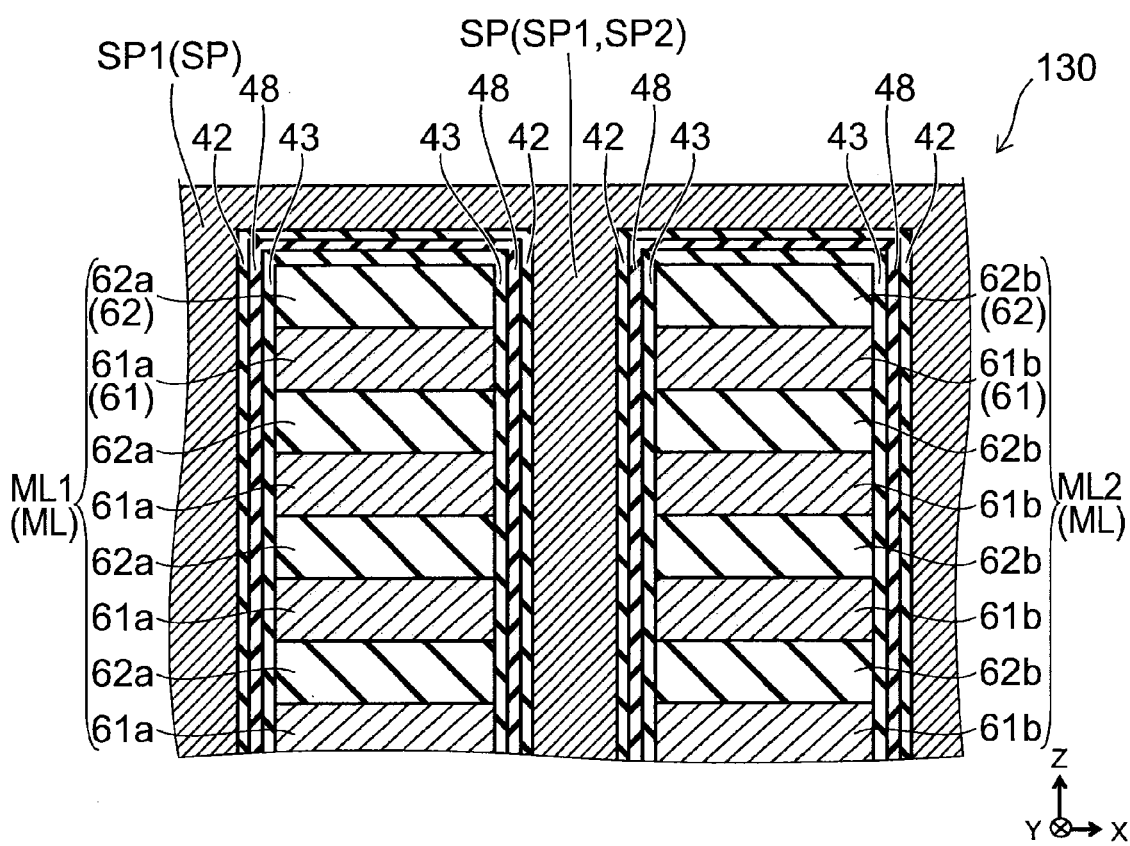
FIG. 23 is a schematic cross-sectional view illustrating the configuration of a nonvolatile semiconductor memory device according to a fourth embodiment.

FIG. 23 is a schematic cross-sectional view illustrating the configuration of a nonvolatile semiconductor memory device according to a fourth embodiment.

As shown in FIG. 23, also in a nonvolatile semiconductor memory device 130 according to this embodiment, the stacked structure body ML (the first stacked structure body ML1 and the second stacked structure body ML2) is provided.

The electrode-side insulating film 43 is provided so as to cover the side face of the stacked structure body ML. The organic film 48 is provided so as to cover the electrode-side insulating film 43. The semiconductor-side insulating film 42 is provided so as to cover the organic film 48. Furthermore, the semiconductor layer SP is provided so as to be embedded in the recess between the semiconductor-side insulating film 42 covering the first stacked structure body ML1 and the semiconductor-side insulating film 42 covering the second stacked structure body ML2.

The semiconductor layer SP opposed to the first stacked structure body ML1 corresponds to the first semiconductor layer SP1.

The semiconductor layer SP opposed to the second stacked structure body ML2 corresponds to the second semiconductor layer SP2.

The first stacked structure body ML1 and the second stacked structure body ML2 extend along the Y-axis direction, for example. That is, the first electrode film 61a and the second electrode film 61b extend along the Y-axis direction. The first electrode film 61a and the second electrode film 61b function as word electrodes.

On the other hand, the semiconductor layer SP extends along the X-axis direction. Although one semiconductor layer SP is shown in FIG. 23, a plurality of semiconductor layers SP may be provided. The plurality of semiconductor layers SP are aligned along the Y-axis direction, for example. The plurality of semiconductor layers SP function as bit lines. That is, the direction in which the word line extends is the Y-axis direction and the direction in which the bit line extends is the X-axis direction.

Also in this case, the semiconductor layer SP is opposed to the side faces of the plurality of electrode films 61. The organic film 48 is provided between the side faces of the plurality of electrode films 61 and the semiconductor layer SP, and contains an organic compound. The semiconductor-side insulating film 42 is provided between the organic film 48 and the semiconductor layer SP. The electrode-side insulating film 43 is provided between the organic film 48 and the side faces of the plurality of electrode films 61.

Also in the nonvolatile semiconductor memory device 130 having such a structure, the configuration described in regard to the first embodiment is applied to the organic film 48. That is, a monomolecular film, for example, may be used for the organic film 48. Also in this embodiment, a nonvolatile semiconductor memory device with increased integration degree can be provided.

As described above, the embodiment can provide a nonvolatile semiconductor memory device with increased integration degree and a method for manufacturing the same.

Hereinabove, embodiments of the invention are described with reference to specific examples. However, the invention is not limited to these specific examples. For example, one skilled in the art may appropriately select specific configurations of components of nonvolatile semiconductor memory devices such as electrode films, inter-electrode insulating films, selection gate electrodes, semiconductor layers, connection portions, connection portion conductive films, organic films, semiconductor-side insulating films, electrode-side insulating films, insulating films, conductive films, interlayer insulating films, source lines, and bit lines from known art and similarly practice the invention. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all nonvolatile semiconductor memory devices and methods for manufacturing the same practicable by an appropriate design modification by one skilled in the art based on the nonvolatile semiconductor memory devices and the methods for manufacturing the same described above as embodiments of the invention also are within the scope of the invention to the extent that the purport of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a nonvolatile semiconductor memory device including a stacked structure body including a plurality of electrode films stacked along a first direction and an inter-electrode insulating film provided between the electrode films, a semiconductor layer opposed to side faces of the electrode films, an organic film provided between the side faces of the electrode films and the semiconductor layer and containing an organic compound, a semiconductor-side insulating film provided between the organic film and the semiconductor layer, and an electrode-side insulating film provided between the organic film and the side faces of the electrode films, the method comprising:
    alternately stacking a plurality of first films and a plurality of second films along the first direction to form a base body, the base body being to be at least part of the stacked structure body;
    forming a through hole penetrating through the base body along the first direction and burying a semiconductor in the through hole to form the semiconductor layer;
    removing the plurality of first films;
    forming an insulating film on a side face of the semiconductor layer exposed by removing the plurality of first films to form the semiconductor-side insulating film;
    forming the organic film on the semiconductor-side insulating film;
    forming the electrode-side insulating film on the organic film; and
    forming a conductive film on the electrode-side insulating film to form the electrode films,
    wherein the organic film is bonded to the semiconductor-side insulating film by at least one of an ether linkage, a silyl ether linkage, an ester linkage, a thioether linkage.

2. The method according to claim 1, wherein the forming the organic film includes processing using a self-assembly method.

3. The method according to claim 1, wherein forming the electrode films includes recessing the conductive film.

4. The method according to claim 1, wherein the organic film is bonded to the semiconductor-side insulating film by a silyl ether linkage.

5. The method according to claim 1, wherein
    the semiconductor layer penetrates through the stacked structure body along the first direction,
    the semiconductor-side insulating film surrounds a side face of the semiconductor layer,
    the organic film surrounds a side face of the semiconductor-side insulating film, and
    the electrode-side insulating film surrounds a side face of the organic film.

6. The method according to claim 1, wherein the organic film is a monomolecular film.

7. The method according to claim 1, wherein the organic film contains at least one selected from the group consisting of Zn, Cu, Fe, Ru, and Ir.

8. The method according to claim 1, wherein the organic film contains at least one of a porphyrin, a metallocene, and a bipyridine.

9. The method according to claim 1, wherein the organic film includes at least one of a zinc porphyrin, a ferrocene and an iron bis(terpyridine).

10. The method according to claim 1, wherein the semiconductor-side insulating film contains a metal oxide.

* * * * *